United States Patent
Lo et al.

(10) Patent No.: US 11,556,058 B2
(45) Date of Patent: Jan. 17, 2023

(54) PROXIMITY EFFECT CORRECTION IN ELECTRON BEAM LITHOGRAPHY

(71) Applicant: TAIWAN SEMICONDUCTOR MANUFACTURING CO., LTD., Hsinchu (TW)

(72) Inventors: Wen Lo, Taipei (TW); Shih-Ming Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 600 days.

(21) Appl. No.: 16/664,425

(22) Filed: Oct. 25, 2019

(65) Prior Publication Data

US 2020/0133139 A1    Apr. 30, 2020

Related U.S. Application Data

(60) Provisional application No. 62/753,909, filed on Oct. 31, 2018.

(51) Int. Cl.
| | | |
|---|---|---|
| *H01J 37/317* | (2006.01) | |
| *H01J 37/304* | (2006.01) | |
| *G03F 7/20* | (2006.01) | |

(52) U.S. Cl.
CPC ........ *G03F 7/70433* (2013.01); *H01J 37/304* (2013.01); *H01J 37/3174* (2013.01); *H01J 2237/31769* (2013.01)

(58) Field of Classification Search
CPC . G03F 7/70433; H01J 37/304; H01J 37/3174; H01J 2237/31769
See application file for complete search history.

(56) References Cited

U.S. PATENT DOCUMENTS

| | | |
|---|---|---|
| 8,796,666 B1 | 8/2014 | Huang et al. |
| 8,945,803 B2 | 2/2015 | Chen et al. |
| 9,093,530 B2 | 7/2015 | Huang et al. |
| 9,269,537 B2 | 2/2016 | Tseng et al. |
| 9,274,412 B2 * | 3/2016 | Fujimura .................. G03F 1/78 |

(Continued)

OTHER PUBLICATIONS

Takayuki Abe et al., "Proximity effect correction for an electron beam direct writing system EX-7" Journal of Vacuum Science & Technology B: Microelectronics Processing and Phenomena 7, 1524 (1989); doi: 10.1116/1.584525.

(Continued)

*Primary Examiner* — Sean M Luck
(74) *Attorney, Agent, or Firm* — McDermott Will & Emery LLP

(57) ABSTRACT

A method of generating a layout pattern includes determining a first energy density indirectly exposed to a first feature of one or more features of a layout pattern on an energy-sensitive material when the one or more features of the layout pattern on the energy-sensitive material are directly exposed by a charged particle beam. The method also includes adjusting a second energy density exposed the first feature when the first feature is directly exposed by the charged particle beam. A total energy density of the first feature that comprises a sum of the first energy density from the indirect exposure and the second energy density from the direct exposure is maintained at about a threshold energy level to fully expose the first feature in the energy-sensitive material.

20 Claims, 15 Drawing Sheets

(56) References Cited

U.S. PATENT DOCUMENTS

| | | | |
|---|---|---|---|
| 9,305,799 B2 | 4/2016 | Chen et al. | |
| 9,336,993 B2 | 5/2016 | Yu | |
| 9,367,661 B2 | 6/2016 | Jou et al. | |
| 9,529,959 B2 | 12/2016 | Wang et al. | |
| 9,548,303 B2 | 1/2017 | Lee et al. | |
| 9,810,994 B2 * | 11/2017 | Lin | G03F 7/70275 |
| 2008/0203324 A1 * | 8/2008 | Fujimura | G03F 7/70558 |
| | | | 250/492.23 |
| 2011/0253911 A1 * | 10/2011 | Matsumoto | H01J 37/3174 |
| | | | 250/492.3 |
| 2013/0201468 A1 * | 8/2013 | Manakli | H01J 37/3174 |
| | | | 355/77 |
| 2014/0077103 A1 * | 3/2014 | Matsumoto | H01J 37/3026 |
| | | | 250/492.3 |
| 2015/0041684 A1 * | 2/2015 | Kato | H01J 37/3174 |
| | | | 716/55 |
| 2015/0243481 A1 * | 8/2015 | Wieland | H01J 37/3177 |
| | | | 250/492.22 |
| 2021/0313143 A1 * | 10/2021 | Fujimura | G03F 1/70 |

OTHER PUBLICATIONS

Takashi Kamikubo et al., "Proximity Effect Correction for Electron Beam Lithography: Highly Accurate Correction Method," Japanese Journal of Applied Physics, vol. 36, Part 1, No. 12B (1997); https://doi.org/10.1143/JJAP.36.7546.

* cited by examiner

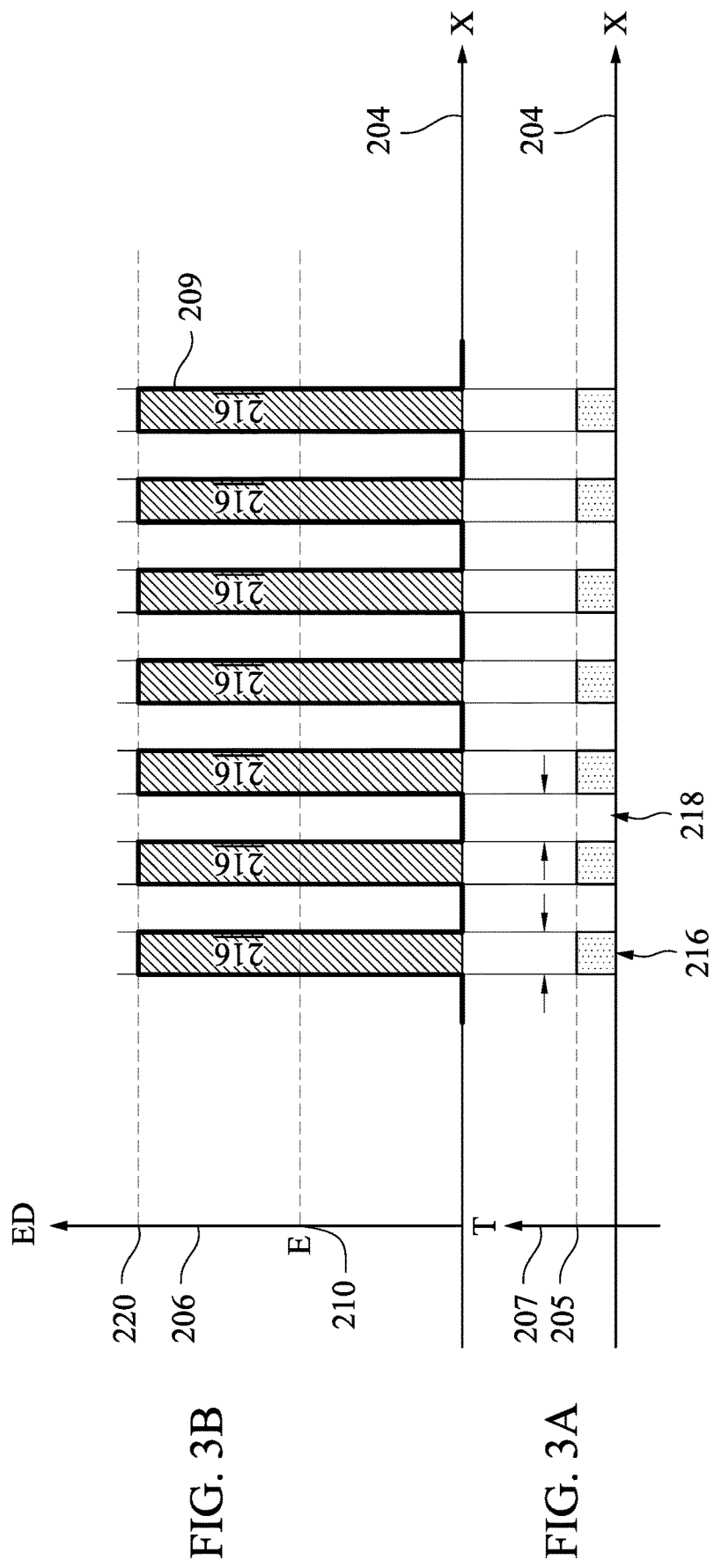

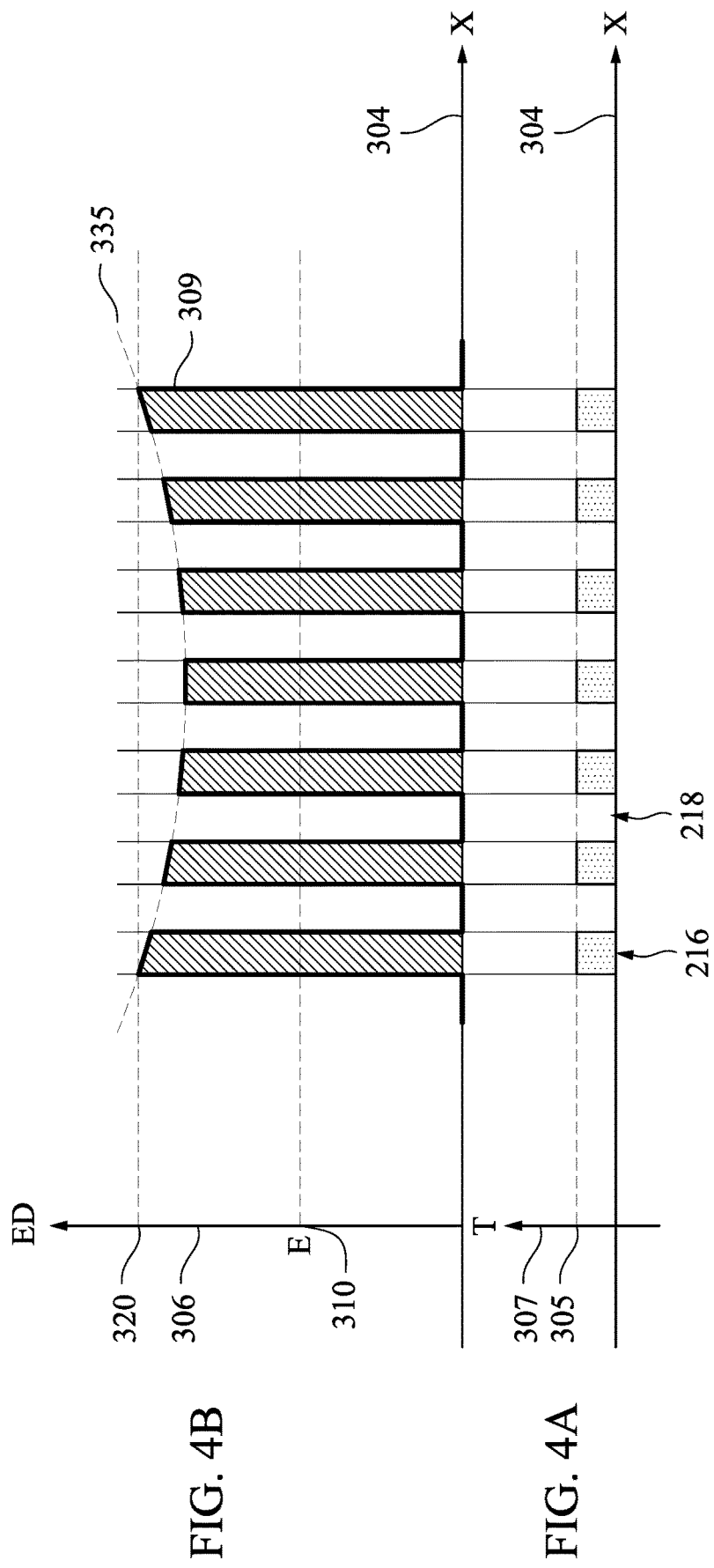

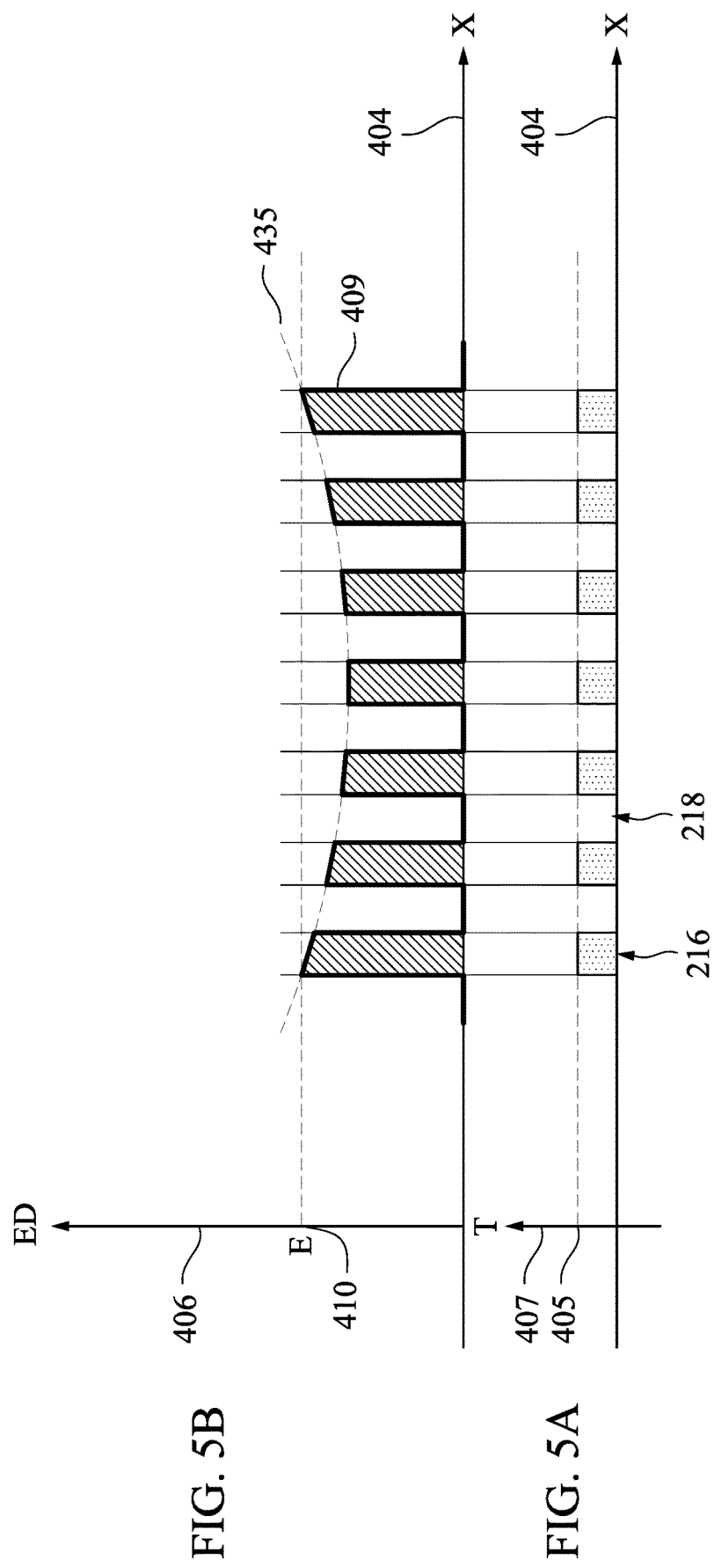

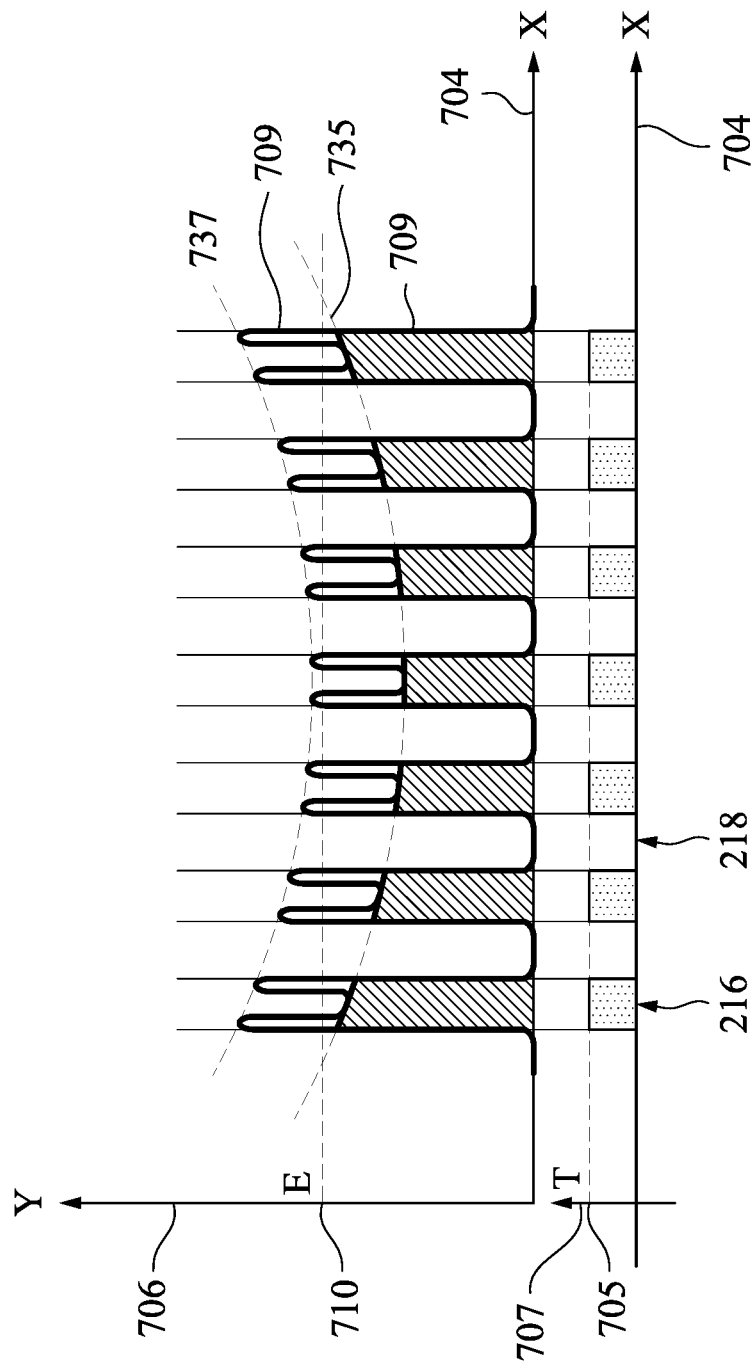

PROXIMITY EFFECT CORRECTION IN ELECTRON BEAM LITHOGRAPHY

PRIORITY CLAIM AND CROSS-REFERENCE

This application claims priority to U.S. Provisional Application No. 62/753,909 filed on Oct. 31, 2018, entitled "Proximity Effect Correction in Electron Beam," the entire disclosure of which is incorporated herein by reference.

BACKGROUND

Lithography is used for patterning the surface of a semiconductor wafer that is covered by a resist material. The resist material is patterned so that portions of the resist material can be selectively removed to expose underlying areas of the semiconductor wafer for selective processing such as etching, material deposition, implantation and the like. Photolithography utilizes light energy, including the ultraviolet light or X-ray, for selective exposure of the resist material. Alternatively, charged particle beams, e.g., electron beams and ion beams, have been used for high resolution lithographic resist exposure.

Some of the electrons or ions entering the resist material that is being exposed may be scattered around and into neighboring areas. The scattering may cause electrons or ions to enter the resist material in areas outside of the resist material that is being directly exposed. The scattering may cause indirect exposure of the areas adjacent to the resist material that is being directly exposed. Thus, in an electron beam or ion beam energy delivery process, it is desirable to adjust the exposure time and the amount of the energy delivered to the resist material such that selected locations of the resist are fully exposed and neighboring areas are not significantly exposed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, and 3C respectively show a cross-sectional view of a layout pattern of a resist produced by an electron beam lithography system, an energy density delivered by the electron beam lithography system to the resist material, and a graph of the energy density delivered by the electron beam lithography system to the resist material.

FIGS. 4A, 4B, and 4C respectively show a cross-sectional view of a layout pattern of a resist produced by an electron beam lithography system, an energy density delivered by the electron beam lithography system to the resist material, and a graph of the energy density delivered by the electron beam lithography system to the resist material in accordance with some embodiments of the present disclosure.

FIGS. 5A, 5B, and 5C respectively show a cross-sectional view of a layout pattern of a resist produced by an electron beam lithography system, an energy density delivered by the electron beam lithography system to the resist material, and a graph of the energy density delivered by the electron beam lithography system to the resist material in accordance with some embodiments of the present disclosure.

FIGS. 7A, 7B, and 7C respectively show a cross-sectional view of a layout pattern of a resist produced by an electron beam lithography system, an energy density delivered by the electron beam lithography system to the resist material, and a graph of the energy density delivered by the electron beam lithography system to the resist material in accordance with some embodiments of the present disclosure.

DETAILED DESCRIPTION

Figure 1A:
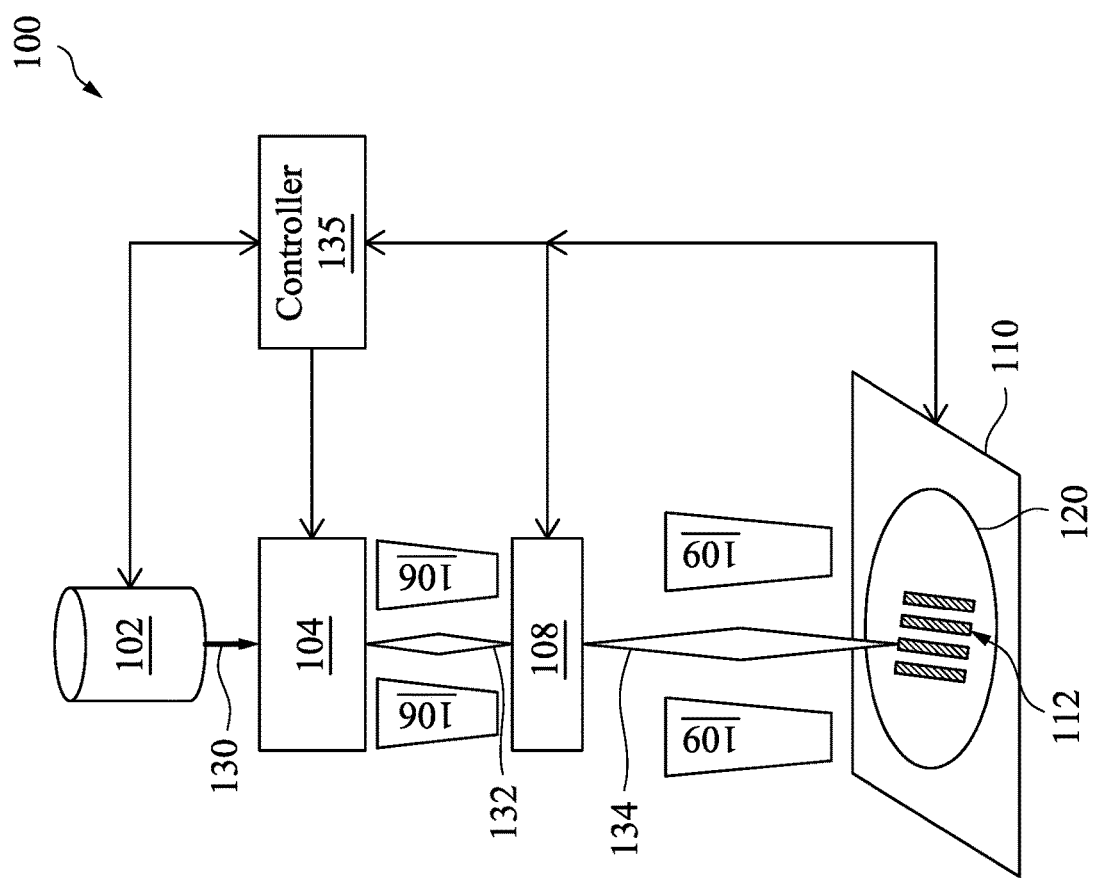
FIGS. 1A and 1B show diagrams of electron beam lithography systems.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to charged particle lithography systems and methods, e.g., electron beam and ion beam lithography systems and methods. More particularly, it is related to apparatuses and methods for analyzing and controlling a layout pattern to be produced in an energy-sensitive material, e.g., a resist material, on a work piece, e.g., a semiconductor wafer, and to avoid and/or reduce non-uniformity of a critical dimension (CD) of the layout pattern on the work piece.

In the case of a positive tone resist material, the resist material is degraded by the charged particle beam such that by subsequent application of a developer of the resist material, the resist material will dissolve in the regions that were fully exposed to the charged particle beam, leaving behind a coating in areas that were not exposed. In the case of a negative tone resist material, the resist material is strengthened (either polymerized or cross-linked) by the charged particle beam, and the developer will dissolve away the regions that were not exposed, leaving behind a coating in areas that were fully exposed. In addition, the resist material, positive tone or negative tone, is considered fully exposed when the energy delivered by the electron beam or ion beam to the resist material, e.g., to a unit area of the resist material, exceeds a threshold energy level. When the energy delivered to the resist material is equal or greater than the threshold energy level, the resist material is either substantially degraded for a positive tone resist, or the resist material is substantially strengthened for a negative tone resist. Electron beams have been used because the low mass of electrons allows accurate control of an electron beam at low power and high speed. Electron beam lithography system is also an effective method to scale down the feature size and provide higher resolution than photolithography. Ion beam lithography offers higher resolution than electron beam lithography, as the ions used in this technique are far heavier than electrons and thus create a much smaller wavelength than electrons.

In some embodiments, a direct exposure of a resist material such that the total energy delivered to the resist material exceeds the resist threshold energy level is reduced by the indirect exposure of the resist material from adjacent areas. Also, when more than the resist threshold energy level is delivered to an area of the resist material, the scattering may cause the exposure of the neighboring area such that the neighboring area receives the resist threshold energy level.

As noted, the resist material, positive or negative tone, is considered fully exposed when the energy delivered by the electron beam or ion beam to the resist material, e.g., the energy density delivered to the resist material, exceeds a threshold energy level. In some embodiments, the fully exposed positive tone resist material is dissolved by the application of the developer and, thus, is removed from the wafer. The non-exposed positive tone resist material is not dissolved by the application of the developer and thus remains on the wafer. In some embodiments, the fully exposed negative tone resist material does not dissolve by the application of the developer and, thus, the fully exposed negative tone resist material remains on the wafer. However, the non-exposed negative tone resist material is dissolved by the application of the developer and is removed from the wafer.

In some embodiments, when an electron beam enters the resist material, in a forward scattering process, one or more electron-electron interactions with the electrons of the resist material may deflect the primary electrons one or more times and thus scatter the electron beam in the resist material. In each electron-electron interaction, the forward scattering process may transfer part of the energy of the electron to the resist material. The forward scattering process may scatter the electron in the resist material from few nanometers to tens of nanometers and thus may distribute the energy of the electron beam in few nanometers to tens of nanometers of the resist material. In some embodiments, the energy delivered by the electron beam to the resist material may be scattered by few nanometers to tens of nanometers based on a Gaussian probability distribution function. In some embodiments, some of the electrons do not stop in the resist material and penetrate the substrate under the resist material. These electrons can still contribute to resist material exposure by scattering back into the resist material and causing subsequent electron-electron interactions with the resist material. The energy delivered by the backscattered electrons may further broaden the electron beam scattering and the energy delivered by the electron beam to the resist material may be further distributed.

As discussed, the energy of the electron beam is delivered to two regions of the resist material: a) a first region that the electron beam energy is directly delivered to by directing the electron beam to the first region, and b) a second region that the electron beam energy is indirectly delivered to by scattering the electron beam that is directed to the first region. When some specific portions of the second region, e.g., portions neighboring the first region, are fully exposed such that the energy delivered to the specific portions exceed the threshold energy level, the first region is broadened by the exposed specific portions. In some embodiments, in a positive tone resist material, broadening the exposed portions increases the CD of the layout pattern and in a negative tone resist material broadening the exposed portions, shrinks the CD of the layout pattern.

The layout pattern that is produced in the resist material on the wafer may not be uniform and may include one or more dense areas having a number of closely packed features and one or more dispersed areas having few loosely packed features. The indirect exposure of the resist material from adjacent areas is higher for a feature in a dense area compared to a feature in a dispersed area. Also, the indirect exposure of the resist material from adjacent areas is higher for a feature in the middle of a dense area compared to a feature near an edge of the dense area. In some embodiments, the same amount of electron beam energy is directly delivered to the features of the dense area to fully expose the features of the dense area. In addition, a first feature and the vicinity of the first feature in the middle of a dense area receives more indirect exposure compared to a second feature and the vicinity of the second feature near an edge of the dense area. When the same amount of electron beam energy is directly delivered to the features of the dense area, the total energy delivered to the first feature and the vicinity of the first feature is higher than the total energy delivered to the second feature and the vicinity of the second feature. Thus, a CD non-uniformity may be observed between the features in the middle and the features at the edge of the dense area and the fully exposed feature in the middle of the dense area becomes broader than the fully exposed feature at the edge of the dense area.

When the same amount of electron beam energy, e.g., at least the threshold energy level, is directly delivered to the features of a dense area and the features of a dispersed area then the features of the dense area and the features of the dispersed area are fully exposed. However, a first feature and the vicinity of the first feature in the dense area receives more indirect exposure compared to a second feature and the vicinity of the second feature in the dispersed area and the total energy delivered to the first feature and the vicinity of the first feature is higher than the total energy delivered to the second feature and the vicinity of the second feature. Thus, when the same amount of electron beam energy is directly delivered to the features of the dense area and the features of the dispersed area to fully expose the dense area and the dispersed area, a CD non-uniformity may be observed between the features of the dense area and the features of the dispersed area and the fully exposed features of the dense area may become broader than the fully exposed features of the dispersed area.

In some embodiments, the amount of energy directly delivered to the resist material is controlled by a control system. The control system adjusts the amount of energy directly delivered to a first feature in the resist material based on the features of the layout pattern neighboring the first feature such that the first feature is fully exposed but the total energy delivered by direct exposure and indirect exposure to the first feature does not exceed, e.g., does not significantly exceed, the threshold energy level. By maintaining the amount of total energy delivered to one or more features of the resist material at about the threshold level, the CD uniformity may be maintained among the features produced in the resist material.

In some embodiments, the control system receives the layout pattern to be produced by an electron beam in the resist material. The control system also receives the resist material information and the information of the electron beam, e.g., electron beam energy. In some embodiments, the control system calculates, e.g., simulates, the amount of indirect exposure of the features of layout pattern. Then, the control system calculates the amount of the direct exposure to be delivered to each feature of the layout pattern such that the total energy delivered by direct exposure and indirect exposure to the features of the layout pattern are maintained at the threshold energy level. In some embodiments, the control system controls an electron beam lithography system such that by adjusting the electron beam energy and timing, the calculated amount of direct exposure is delivered to each feature of the layout pattern such that the total amount of energy delivered to each feature is maintained at the threshold energy level. In some embodiments, the amount of energy delivered to a feature is determined as energy per unit area or energy density and the threshold energy level is a threshold for energy density.

The advanced lithography process, method, and materials described in the current disclosure can be used in many applications, including the manufacturing of fin-type field effect transistors (FinFETs). For example, the fins may be patterned to produce a relatively close spacing between features, for which this disclosure is well suited. In addition, spacers used in forming the fins of the FinFETs can be processed according to this disclosure.

Figure 1B:
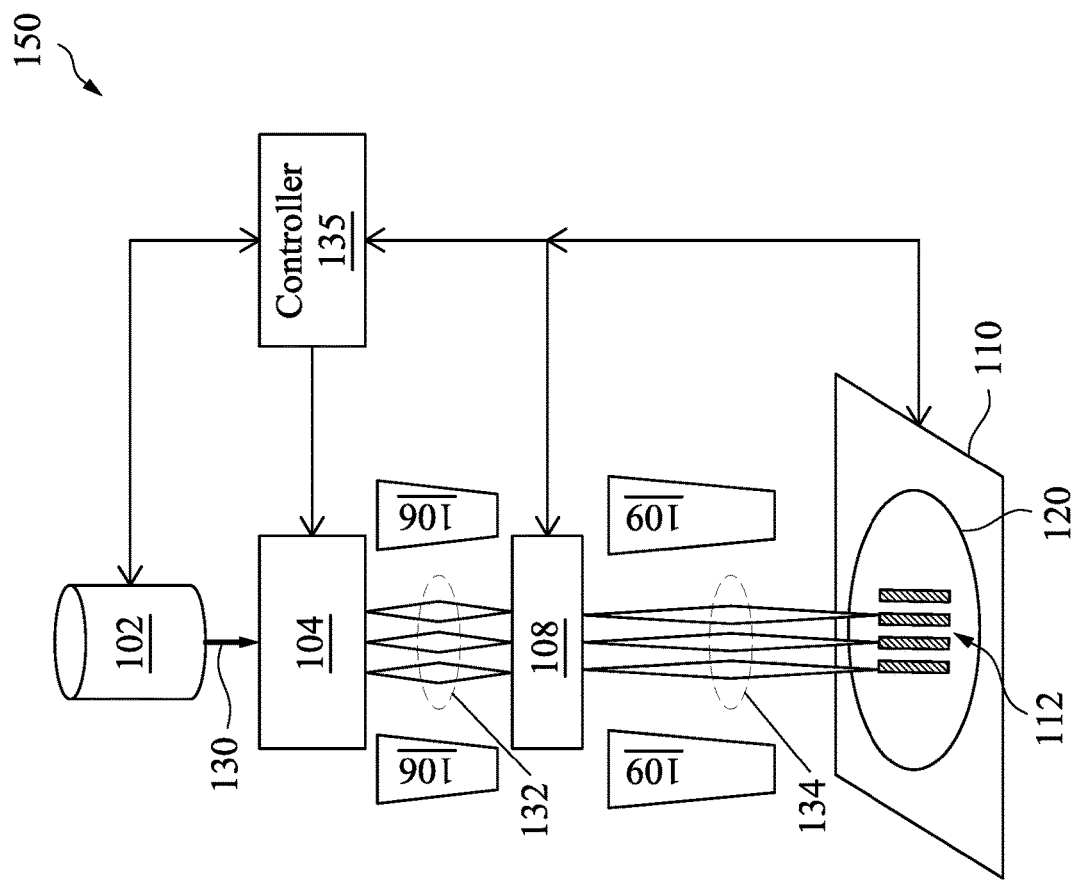

FIGS. 1A and 1B show diagrams of electron beam lithography systems 100 and 150 that include a controller 135, a charge particle source, e.g., an electron source 102, one or more focusing lenses 106 and 109, a beam forming unit 104, and a shutter-deflector unit 108. The electron-beam lithography systems 100 and 150 use an electron-based imaging for layout patterning. The electron beam lithography systems 100 and 150 transfer the layout pattern to an electron-beam sensitive resist layer on a semiconductor wafer 120. In some embodiments, the focusing lenses 106 and 109 of FIGS. 1A and 1B are cross-sections of a magnetic cylinder, e.g., a magnetic disc, surrounding the electron beam and having a central opening for the electron beam to pass through. In some embodiments, the magnetic field of the magnetic cylinder is used to focus the electron beam.

In the electron beam lithography systems 100, the electron source 102 provides an electron emission 130. The electron emission 130 from the electron source 102 is received by the beam forming unit 104. The beam forming unit 104 generates an electron beam 132. The electron beam 132 is focused by one or more focusing lenses 106. The electron beam 132 is received by a shutter-deflector unit 108. The shutter-deflector unit 108 may turn the electron beam on and off. When the shutter-deflector unit 108 is open and the electron beam is turned on, an electron beam 134 exits the shutter-deflector unit 108, passes through focusing lenses 109, and focuses on the semiconductor wafer 120 to produce the layout pattern 112 in the resist layer of the semiconductor wafer 120.

In some embodiments, the semiconductor wafer 120 is on a stage 110 and the controller 135 moves the stage 110 to generate the layout pattern 112 by movement of the stage 110. In some embodiments, the shutter-deflector unit 108 of the electron-beam lithography system 100 deflects the electron beam 134, based on the layout pattern, to generate the layout pattern 112 on the semiconductor wafer 120. In some embodiments, in addition to the movement of the stage 110, the shutter-deflector unit 108 deflects the electron beam 134 to generate the layout pattern 112 in the resist material of the semiconductor wafer 120. In some embodiments, the controller 135 is coupled to the electron source 102, the beam forming unit 104, the shutter-deflector unit 108, and the stage 110. The controller 135 may control the electron source 102 to adjust the intensity of electron beam 134. In some embodiments, the controller 135 receives the layout pattern and by controlling the beam forming unit 104, the shutter-deflector unit 108, and the stage 110 generates the layout pattern 112 in the resist material of the semiconductor wafer 120. Thus, by controlling the intensity of the electron beams 132 and 134, the deflection of the electron beam 134 and/or the movement of the stage 110, the controller 135 of the electron beam lithography systems 100 may generate the layout pattern 112 in the resist material of the semiconductor wafer 120.

In the electron beam lithography systems 150, the electron source 102 provides an electron emission 130. The beam forming unit 104 generates multiple electron beams 132. The electron beams 132 are focused by one or more focusing lenses 106. The electron beams 132 are received by the shutter-deflector unit 108. When the shutter-deflector unit 108 is open and the electron beams are turned on, multiple electron beams 134 exit the shutter-deflector unit 108, pass through focusing lenses 109, and focus on the semiconductor wafer 120 to produce the layout pattern 112 in the resist layer of the semiconductor wafer 120. Thus, by controlling the intensity of the multiple electron beams 132 and 134, the deflection of the multiple electron beams 134 and/or the movement of the stage 110, the controller 135 of the electron beam lithography systems 150 may generate the layout pattern 112 in the resist material of the semiconductor wafer 120. In some embodiments, the multiple electron beams 134 are separately controlled and deflected by the shutter-deflector unit 108.

In some embodiments, the charged particle source of FIGS. 1A and 1B is an ion beam source. The beam forming unit 104, focusing lenses 106 and 109, and the shutter-deflector unit 108 focus an ion beam on the resist material on the semiconductor wafer 120 to generate the layout pattern 112 on the wafer. In some embodiments, the ion beam includes hydrogen ions, which are several hundred times heavier than electrons. Thus, in some embodiments, the energy of the ion beam, compared to the electron beam, becomes less scattered and creates more local impact inside the resist material. In some embodiments, the ion beam is an ion that is stopped in the resist material and does not penetrate the substrate under the resist material, and thus does not contaminate the substrate under the resist material and/or does not impact the crystalline structure of the substrate. In some embodiments, gallium ions or helium ions are used for ion beam lithography.

Figure 2B:
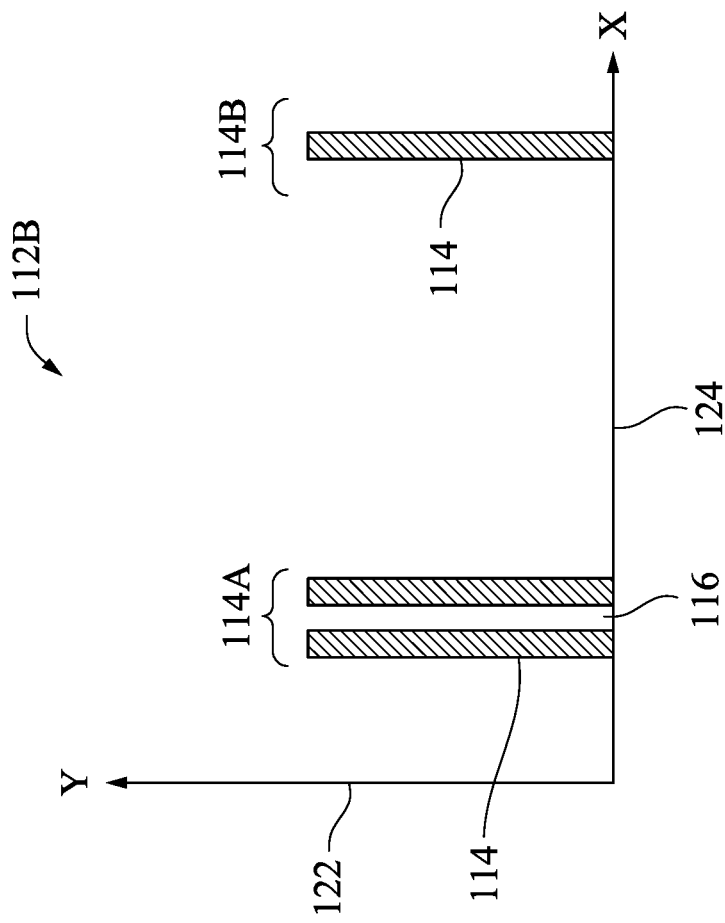
FIGS. 2A and 2B illustrate layout patterns to be generated by an electron beam lithography system on a resist material in accordance with some embodiments of the present disclosure.
Figure 2A:
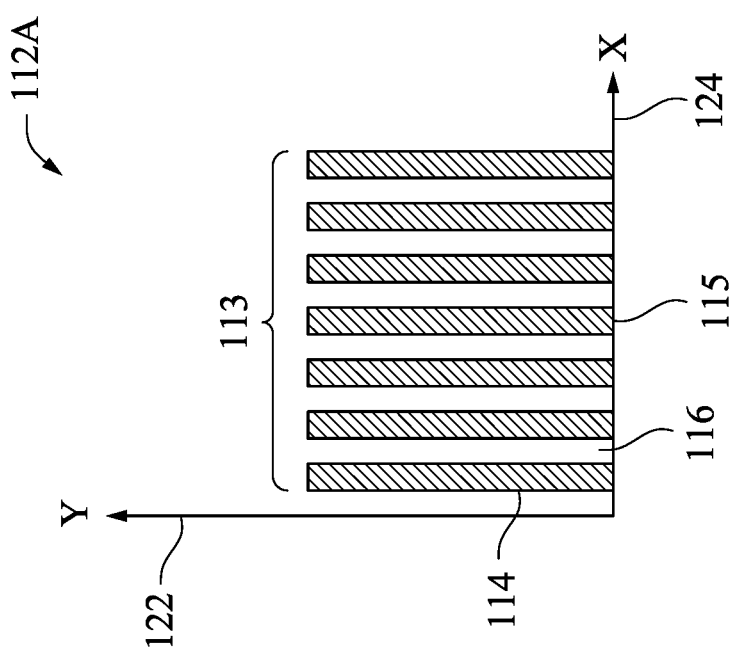

FIGS. 2A and 2B illustrate layout patterns to be generated by a charged particle beam lithography system, e.g., an electron beam lithography system, on a resist material in accordance with some embodiments of the present disclosure. FIG. 2A shows a layout pattern 112A that is extended in a Y-direction 122 and distributed in a X-direction 124 and having a dense area 113 with a number of closely packed features, e.g., seven dark strips 114, which is consistent with the layout pattern 112 of FIGS. 1A and 1B. FIG. 2B shows a layout pattern 112B that is extended in a Y-direction 122 and distributed in the X-direction 124 and having two dispersed areas 114A and 114B with one or two dark strips 114. In some embodiments, the dark strips 114 are the features that remain on the wafer and the bright strips 116 are the locations that are dissolved by the application of a developer, and thus, is removed from the wafer. Therefore, for a negative tone resist material, the electron beam 134 of FIGS. 1A and 1B is focused on the dark strips 114 and for a positive tone resist material, the electron beam 134 of FIGS. 1A and 1B is focused on the bright strips 116.

In some embodiments and for a negative tone resist material, the dark strips 114 of the dense area 113 receive more indirect exposure compared to the dark strips 114 of the dispersed areas 114A and 114B. In some embodiments, the central dark strip 115 of the dense area 113 receives more indirect exposure compared to the other the dark strips 114 of the dense area 113. Thus part of the bright strip 116 adjacent to the central dark strip 115 may be fully exposed and the CD of the central dark strip 115 may become greater than the CD of the other dark strips 114. When the CD of the dark strips 114 at both ends of the layout pattern 112A in the X-direction 124 have a smaller value compared to the CD of other dark strips 114 and compared to the CD of the central dark strip 115, a CD non-uniformity may be observed in the dense area 113 in the X-direction 124. In some embodiments, a portion of a feature is exposed at a time. Thus, when a feature, e.g., the central dark strip 115, is exposed in one portion, the other portion of the central dark strip 115 and the other dark strips 114 are indirectly exposed.

Figure 3C:
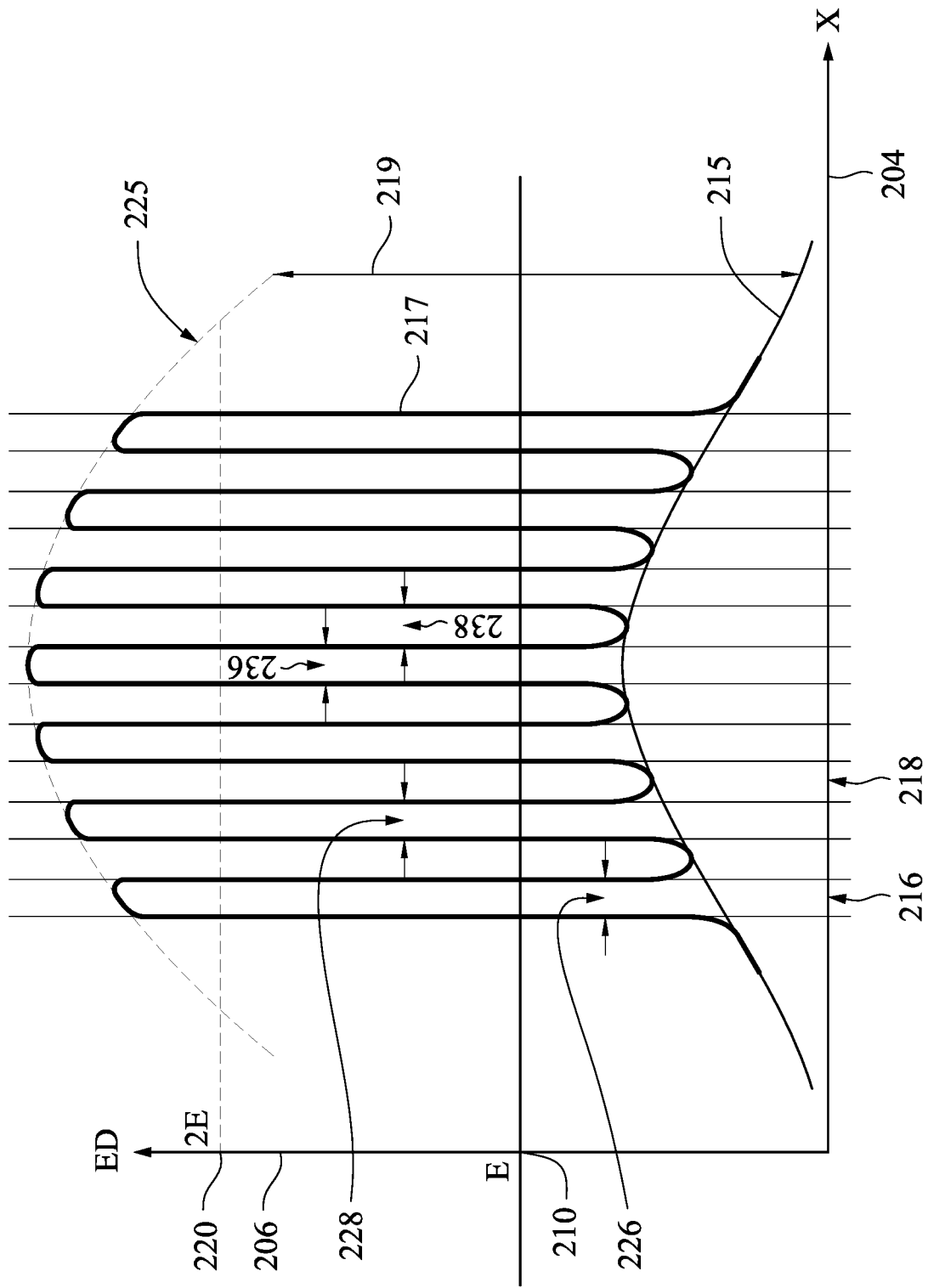

FIGS. 3A, 3B, and 3C respectively show a cross-sectional view of a layout pattern of a resist generated by a charged particle lithography system, e.g., an electron beam lithography system, an energy density delivered by the electron beam lithography system to the resist material, and a graph of the energy density delivered by the electron beam lithography system to the resist material. FIG. 3A shows a cross-sectional view of a height of a layout pattern on a resist material on a wafer versus location. The cross-sectional view, on the coordinate 207, shows a height 205 at a region 216 and shows a height zero at a region 218 in the X-coordinate 204. The layout pattern is consistent with the layout pattern 112A of FIG. 2A. The cross-sectional view of the layout pattern at a dark region, e.g., a region 216, is part of the resist material that remains on the wafer. The region 216 is consistent with a cross-section of the resist material through the dark strips 114 of FIG. 2A, when the layout pattern 112 is generated on the wafer. Conversely, the cross-sectional view of the layout pattern in the resist material at a bright region, e.g., a region 218, is consistent with a cross-section of the bright strips 116 of FIG. 2A, which is a part of the resist material that is removed from the wafer. In some embodiments, a width of the regions 216 and 218 are from about 0.1 nm to about 1000 nm.

FIG. 3B shows the energy density (ED) versus location that is delivered by the electron beam lithography system. FIG. 3B shows, on a coordinate 206, the energy density directly exposed to the resist material at different locations of the X-coordinate 204. In some embodiments, the resist material is negative tone resist material and an energy density, energy per unit area, to fully expose the resist material is a threshold energy level 210, e.g., a threshold energy density level. In some embodiments as shown in FIG. 3B, an energy density function 209 is applied to the resist material such that at the regions 216 an energy level 220, which is twice the threshold energy level 210, is applied by the electron-beam lithography system 100 to the regions 216 where the resist material remains on the wafer and no energy is applied to the regions 218 where the resist material is removed from the wafer.

FIG. 3C shows a graph of the energy density in the resist material. FIG. 3C shows the graph of the energy density ED at different locations on the X-coordinate 204. A total energy density 217 delivered to the resist material is a sum of the energy density 215 of an indirect exposure and the energy density 219 of direct exposure of the regions 216. The energy density 215 of the indirect exposure is received by a region 216 because other regions 216 of the resist material are directly exposed and the direct exposure of the other regions 216 is scattered in the resist material. Thus, the energy density 215 of the indirect exposure is received in both 216 and 218 regions. The energy density 219 is received because of direct exposure of the resist material in the regions 216 according to the energy density shown in FIG. 3B. As shown in FIG. 3C, the total energy density in the regions 216 that are directly exposed are considerably higher than the threshold energy level 210. In addition, for the closely packed layout pattern of FIG. 3A, the energy density 215 of the indirect exposure received from other regions, e.g., neighboring regions, is significant. In some embodiments, the CD of the directly exposed regions 216 increases because of the extra energy density 215 of the indirect exposure and because the total exposure is considerably more than the threshold energy level 210. The energy density 215 of the indirect exposure is higher at the center of the layout pattern and thus the CD 236 of a region 216 at the center of the layout pattern is greater than the CD 226 of a region 216 near an edge of the layout pattern. Conversely, a width 238 of the unexposed region 218 in the center of the layout pattern is smaller than width 228 of the unexposed region 218 near an edge of the layout pattern. Thus, a CD non-uniformity may be observed in FIG. 3C. A total energy density envelope 225 delivered to the resist material is a sum of the energy density 215 of an indirect exposure and the energy density of direct exposure of the regions 216.

In some embodiments, the energy density function 209 is a density of energy directly delivered by the electrons of the electron beam to the resist material. In some embodiments, an average energy of an electron of the electron beam that is delivered to the resist material by direct exposure is determined. Thus, the terms energy density and electron density may alternatively be used and the energy density function 209 that represents the energy directly delivered to the resist material may alternatively represent the electron density delivered by the electron beam to the regions 216 of the resist material. In some embodiments, the energy density 215 of the indirect exposure is a convolution of the point spread function (PSF) of equation (1) with the energy density function 209, where the PSF represents the scattering of electron energy in the resist material.

$$PSF = \frac{1}{\pi\sigma^2} e^{\frac{-(x)^2}{\pi\sigma^2}} \qquad \text{equation (1)}$$

In some embodiments, when a positive tone resist is used and because the exposed regions 216 are removed and the regions 218 that are not directly exposed remain, the CD of a region in the center of the layout pattern is smaller than the CD of a region at the edges of the layout pattern.

As described, when the electron beam enters the resist material, the scattering of the electrons occur until the energy of the electrons are transferred to the resist material. In some embodiments, the interaction of an electron that enters the resist area and the probability of the energy scattering that may happen because of the interactions is modeled as a Gaussian function. In some embodiments, the PSF of the scattering of electron energy in the resist material is a Gaussian function. Thus, the scattering of the electron density of the FIG. 3B may be modeled as a convolution of the Gaussian function with the energy density function 209 of FIG. 3B. In some embodiments, the Gaussian function of the PSF, shown in equation (1) below, has a standard deviation a which is much wider than the rectangles of the energy density function 209, and thus, the result of the convolution, the energy density 215 of the indirect exposure, is very similar to a Gaussian function. In some embodiments, the standard deviation a for the forward scattering is in the order of about 5 nano-meters to about 50 nano-meters. As noted above, the backscattered electrons may further broaden the electron beam scattering and the energy delivered by the electron beam to the resist material by the backscattered electrons may be modeled as another Gaussian function with a standard deviation of microns, e.g., about 1 microns to about 5 microns, that may effectively provide a constant energy density. In some embodiments, the PSF include two Gaussian functions to model both forward scattering and the backscattered electrons.

In some embodiments, when an electron of the electron beam enters the resist material, that electron, which is the primary electron, makes an interaction (a primary interaction) with the resist material and transfers a portion of the energy of the electron to the resist material. The primary interaction may cause a degradation of the positive tone resist material or a strengthening of the negative tone resist material, and thus, exposes the resist material. In addition the primary electron may cause the generation of a secondary electron that scatter in resist material according to equation (1) and the secondary electrons may in turn make an interaction (a secondary interaction) with the resist material. In some embodiments, the energy density function of the electrons of the electron beam is represented by n(x), e.g., the energy density function 209 of FIG. 3B is represented as n(x). As noted, a portion of the energy density function n(x) exposes the resist material through primary interactions and the location of the primary interactions follows the n(x) function. Another portion of the energy density function n(x) exposes the resist material through secondary interactions that scatter in the resist material according to equation (1), and thus, the location of the secondary interactions can be represented by a convolution of n(x) with the PSF function of equation (1). In some embodiments, a total energy transferred to the resist material as a function of location x, is represented by E(x) of equation (2) below, which p1 is a first portion of the electron energy transferred through primary interaction of the direct exposure and p2 is a second portion of the electron energy transferred through secondary interactions of the indirect exposure and the convolution operation is represented by (*):

$$E(x)=p1n(x)*PSF_1+p2n(x)*PSF_2 \qquad \text{equation (2)}$$

where $PSF_1$ is the point spread function of the energy transfer to the resist material by the primary interaction and $PSF_2$ is the point spread function of the energy transfer to the resist material by the secondary interactions. In some embodiments, the $PSF_1$ and $PSF_2$ are probability functions. In some embodiments, the point spread function of the primary interaction shows the distribution of energy in location x when an electron of the electron beam initially interacts with the resist material. Thus, the point spread function of the primary interactions may be a very sharp function, e.g., a very sharp Gaussian function such that the convolution of n(x) with the point spread function of the primary interactions is essentially the same as n(x). In some embodiments, the point spread function of the secondary interactions shows the distribution of energy in location x when an electron of the electron beam makes secondary interactions after the primary interaction that include both forward scattered electrons and back scattered electrons. In some embodiments, the point spread function of the secondary interactions includes two Gaussian functions similar to equation (1), a first Gaussian function with a standard deviation $\sigma_1$ of a few nano-meters, e.g., 10 nano-meters, for forward scattering of the electrons and another Gaussian function with a standard deviation $\sigma_2$ of few microns, e.g., 2 microns, for backscattered electrons. Thus, $PSF_2$ can be presented by equation (3) below where p is a scale factor showing a ratio of the energy distributed through backscattered electrons to the resist material to the energy distributed through forward scattering of the electrons to the resist material.

$$PSF_2 = \frac{1}{\pi\sigma_1^2} e^{\frac{-x^2}{\pi\sigma_1^2}} + p \frac{1}{\pi\sigma_2^2} e^{\frac{-x^2}{\pi\sigma_2^2}} \qquad \text{equation (3)}$$

Thus, the first portion of the equation (2) is due to a direct exposure to the electron beam and the second portion of the equation (2) is due to an indirect exposure to the electron beam. In some embodiments, it is desirable that the energy E(x) transferred to the resist material is above the threshold energy level, e.g., the threshold energy level 210 of FIG. 3C, at the locations that n(x) in non-zero. However, the energy E(x) remains below the threshold energy level at the locations that n(x) is zero.

Figure 4C:
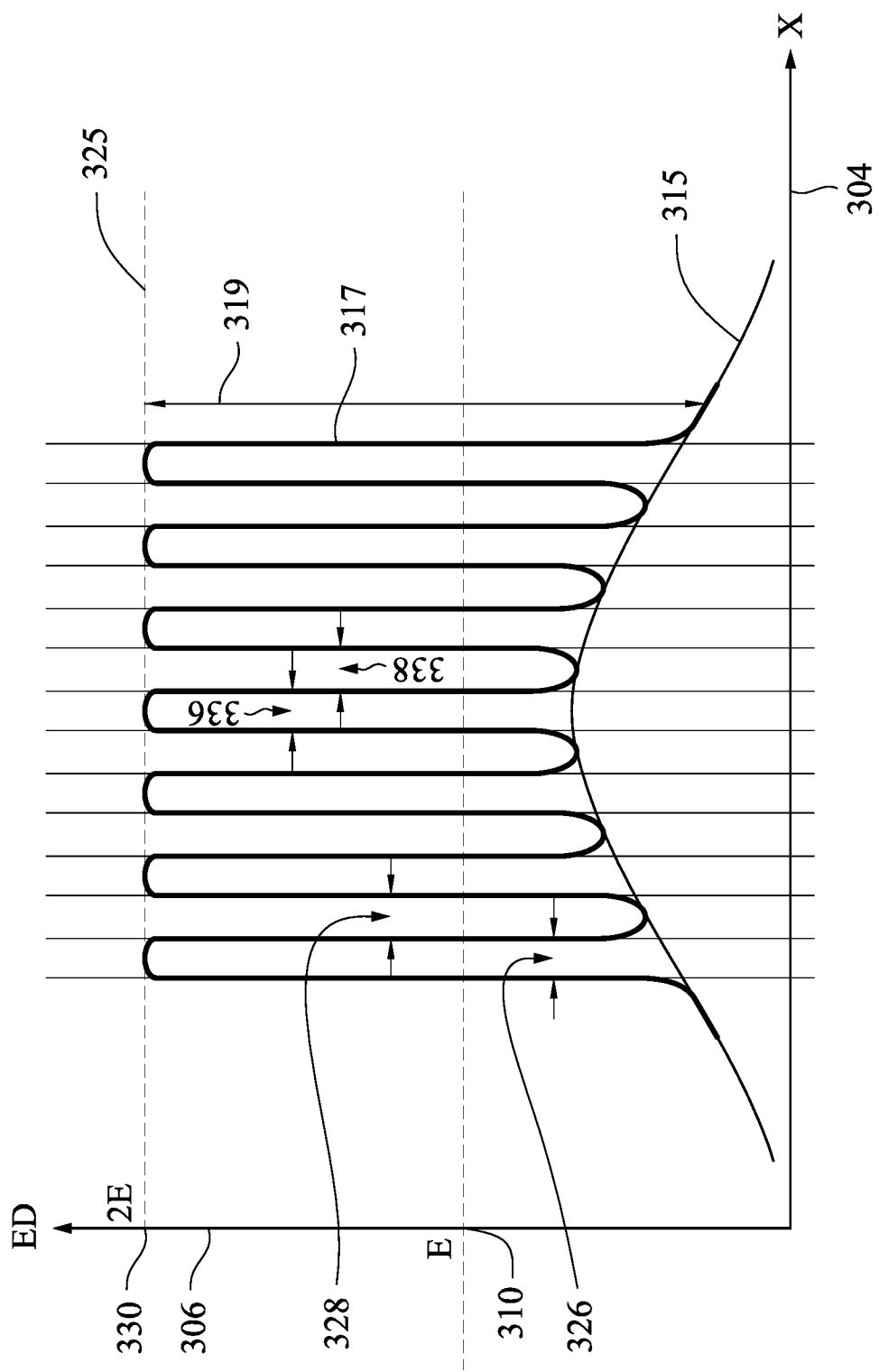

FIGS. 4A, 4B, and 4C respectively show a cross-sectional view of a layout pattern of a resist produced by a charged particle lithography system, e.g., an electron beam lithography system, an energy density delivered by the electron beam lithography system to the resist material, and a graph of the energy density delivered by the electron beam lithography system to the resist material in accordance with some embodiments of the present disclosure. FIG. 4A which is consistent with FIG. 3A shows a cross-sectional view of a height of a layout pattern on a resist material on a wafer versus location. The cross-sectional view, on the coordinate 307, shows a height 305 at a region 216 and shows a height zero at a region 218 in the X-coordinate 304.

FIG. 4B shows the energy density (ED) versus location that is delivered by the electron beam lithography system. FIG. 4B shows, on a coordinate 306, the energy density directly exposed to the resist material at different locations of the X-coordinate 304. In some embodiments, the resist material is a negative tone resist material and an energy density, energy per unit area, to fully expose the resist material is a threshold energy level 310. In some embodiments as shown in FIG. 4B, an energy density function 309 is applied to the resist material such that at the regions 216 an energy level which is smaller than the energy level 320, which is twice the threshold energy level 310, is applied by the electron-beam lithography system 100 to the regions 216 and no energy is applied to the regions 218. The energy density function 309 is adjusted such that the energy density function 309 is smaller at the center of the layout pattern compared to near an edge of the layout pattern. The adjusted energy density function 309 causes less energy to be directly exposed to the regions 216 of FIG. 4B compared to energy exposed to the regions 216 of FIG. 3B. In addition, the adjustment causes less energy to be directly exposed to a region 216 at the center of the layout pattern of FIG. 4B compared to the energy directly exposed to the regions 216 near an edge of the layout pattern of FIG. 4B. A top energy density curve of energy density function 309 is the envelope 335 that is directly delivered (e.g., by direct exposure) by the electrons of the electron beam to the resist material of the regions 216.

FIG. 4C shows a graph of the energy density in the resist material. FIG. 4C shows the graph of the energy density ED at different locations on the X-coordinate 204. A total energy density 317 delivered to the resist material is a sum of the energy density 315 of indirect exposure and the energy density 319 of direct exposure of the regions 216. The energy density 319 is received because of direct exposure of the resist material in the regions 216 according to the energy density function 309 shown in FIG. 3B, and thus, the energy density 319 is smaller in the middle of the layout pattern compared to the edges of the layout pattern. As shown in FIG. 4C, the total energy density in the regions 216 that are directly exposed is considerably higher than the threshold energy level 310. In addition, for the closely packed layout pattern of FIG. 4A, the energy density 315 received due to indirect exposure from other regions, e.g., neighboring regions, is significant. In some embodiments, the energy density 315 of the indirect exposure is a convolution of the equation (1) with the energy density function 309.

As shown in FIG. 4C, the energy density 319 of the direct exposure is adjusted such that the total exposure of the regions 216 are equal throughout the layout pattern. In some embodiments, the total exposure which is the sum of the energy density 315 due to indirect exposure and the energy density 319 due to direct exposure at the regions 216 is equal to energy level 320, which is twice the threshold energy level 310. In some embodiments, the CD of the directly exposed regions 216 increases because of the energy density 315 due to indirect exposure and also because the total exposure is considerably higher than the threshold energy level 310. The energy density 315 of indirect exposure is higher near the center of the layout pattern and thus the energy density 319 of the direct exposure is smaller in the center of the layout pattern such that the total exposure is the same for all the regions 216. Thus, a CD 336 of a region 216 in the center of the layout pattern is equal to a CD 326 of a region 216 at an edge of the layout pattern. Also, a width 338 of the unexposed region 218 in the center of the layout pattern is equal to a width 328 of the unexposed region 218 at an edge of the layout pattern. Thus, although the CD is increased for all the regions 216 compared to a layout pattern such as layout pattern 112B of FIG. 2B, CD non-uniformity may not be observed in FIG. 4C. A total energy density envelope 325 delivered to the resist material is a sum of the energy density 315 of an indirect exposure and the energy density of direct exposure of the regions 216.

Figure 5C:
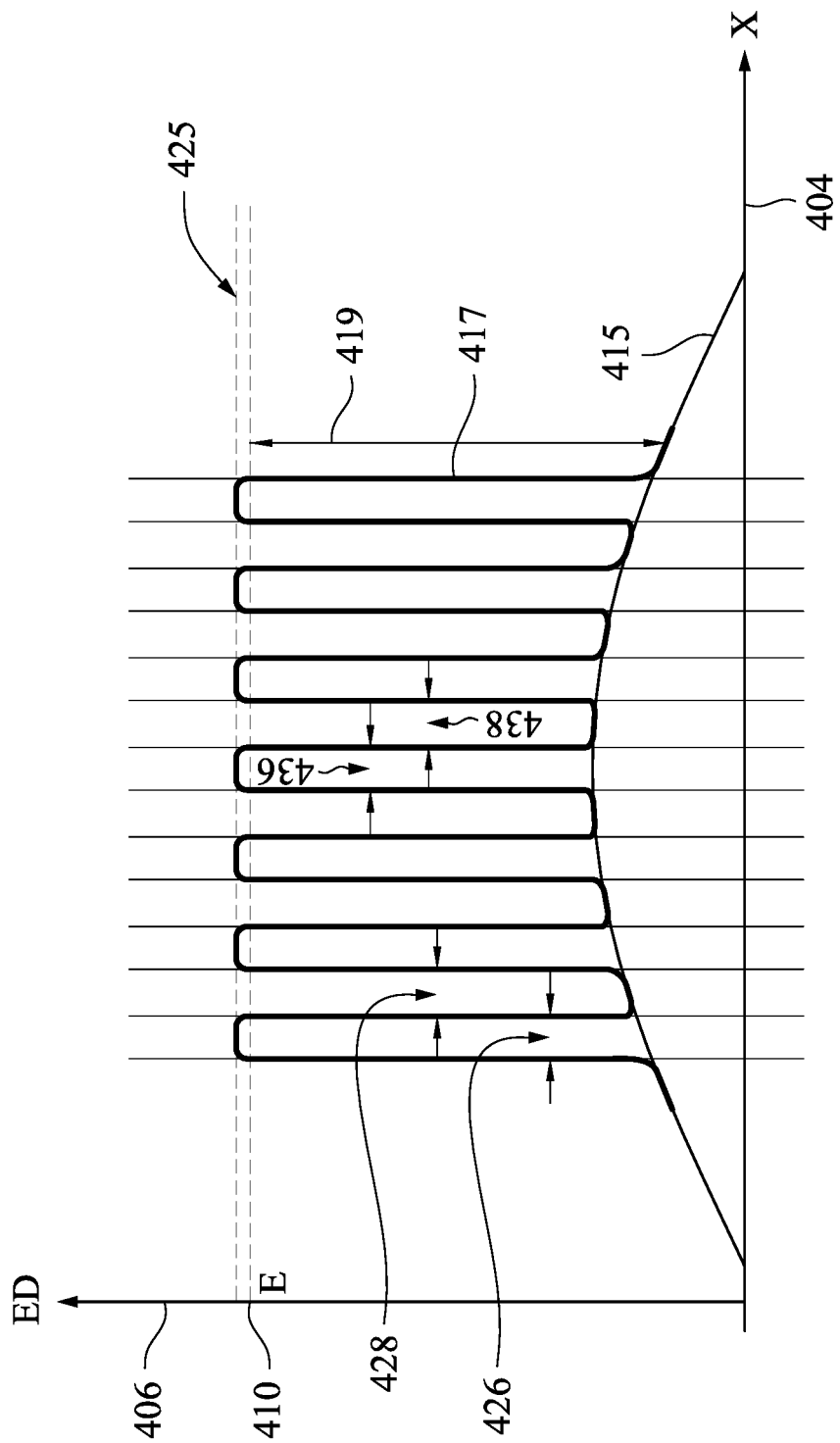

FIGS. 5A, 5B, and 5C respectively show a cross-sectional view of a layout pattern of a resist produced by a charged particle lithography system, e.g., an electron beam lithography system, an energy density delivered by the electron beam lithography system to the resist material, and a graph of the energy density delivered by the electron beam lithography system to the resist material in accordance with some embodiments of the present disclosure. FIG. 5A which is consistent with FIGS. 3A and 4A shows a cross-sectional view of a height of a layout pattern on a resist material on a wafer versus location. The cross-sectional view, on the coordinate 407, shows a height 405 at a region 216 and shows a height zero at a region 218 in the X-coordinate 404.

FIG. 5B shows the energy density (ED) versus location that is delivered by the electron beam lithography system. FIG. 5B shows, on a coordinate 406, the energy density directly exposed to the resist material at different locations of the X-coordinate 404. In some embodiments, the resist material is a negative tone resist material and an energy density, energy per unit area, to fully expose the resist material is a threshold energy level 410. In some embodiments as shown in FIG. 5B, an energy density function 409 is applied to the resist material such that at the regions 216 an energy level which is smaller than the threshold energy level 410, which is the threshold energy level, is applied by the electron-beam lithography system 100 to the regions 216 and no energy is applied to the regions 218. The energy density function 409 is adjusted such that the energy density function 409 is smaller than the threshold energy level 410 and is smaller at the center of the layout pattern compared to near an edge of the layout pattern. The adjusted energy density function 409 causes much less energy to be directly exposed to the regions 216 of FIG. 5B compared to energy exposed to the regions 216 of FIGS. 3B and 4B. In addition, the adjustment causes less energy to be directly exposed to a region 216 at the center of the layout pattern of FIG. 5B compared to the energy directly exposed to the regions 216 near an edge of the layout pattern of FIG. 5B. A top energy density curve, which is the envelope 435 of the energy density function 409 is directly delivered (e.g., by direct exposure) by the electrons of the electron beam to the resist material of the regions 216.

FIG. 5C shows a graph of the energy density in the resist material. FIG. 5C shows the graph of the energy density ED at different locations on the X-coordinate 404. A total energy density 417 delivered to the resist material is a sum of the energy density 415 due to indirect exposure and the energy density 419 due to direct exposure of the regions 216. The energy density 419 is received because of direct exposure of the resist material in the regions 216 according to the energy density function 409 shown in FIG. 5B and thus the energy density 419 is smaller in the middle of the layout pattern compared to the edges of the layout pattern. Because the energy density function 409 of FIG. 5B is considerably smaller, e.g., about one half smaller, than the energy density functions 309 and 209 of FIGS. 3B and 4B, the energy density 415 due to indirect exposure is also considerably smaller than the energy densities 315 and 215 of indirect exposures. In some embodiments, the energy density 315 of the indirect exposure is a convolution of the equation (1) with the energy density function 409. A total energy density envelope 425 delivered to the resist material is a sum of the energy density 415 of an indirect exposure and the energy density of direct exposure of the regions 216.

As shown in FIG. 5B, the total energy density in the regions 216 that are directly exposed are slightly less than the threshold energy level 410, e.g., the threshold energy density level. In addition, for the closely packed layout pattern of FIG. 5A, the energy density 415 received due to indirect exposure from other regions, e.g., neighboring regions, although less than energy densities 315 and 215, still is considerable. As shown in FIG. 5B, the energy density 419 of the direct exposure is adjusted such that the total exposure of the regions 216 are equal throughout the layout pattern. In some embodiments, the total exposure energy density which is the sum of energy density 415 of indirect exposure and energy density 419 of direct exposure at the regions 216 is slightly more than the threshold energy level 410. In some embodiments, the CD of the directly exposed regions 216 increases because of the energy density 415 of the indirect exposures increase. The energy density 415 of the indirect exposures is higher near the center of the layout pattern and thus the energy density 419 of the direct exposures is smaller in the center of the layout pattern such that the total exposure is the same for all regions 216. Thus, a CD 436 of a region 216 in the center of the layout pattern is equal to a CD 426 of a region 216 at an edge of the layout pattern. Also, a width 438 of the unexposed region 218 in the center of the layout pattern is equal to a width 428 of the unexposed region 218 at an edge of the layout pattern. Thus, by maintaining the total exposure slightly above the threshold energy level 410 the CD is not considerably increased compared to a layout pattern, such as layout pattern 112B of FIG. 2B and CD non-uniformity may not be observed in FIG. 5C.

Figure 6:
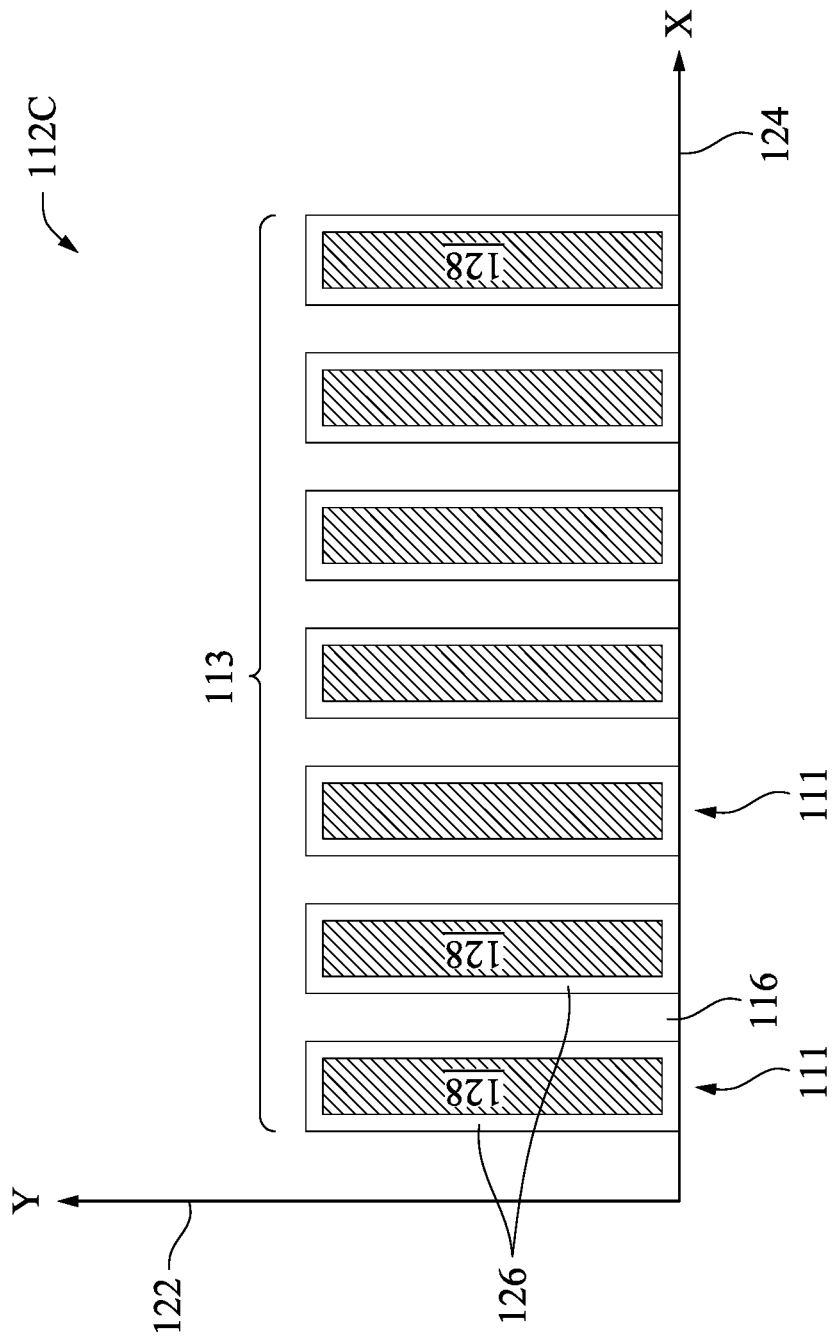
FIG. 6 illustrate layout patterns to be generated by an electron beam lithography system on a resist material in accordance with some embodiments of the present disclosure.

FIG. 6 illustrate layout patterns to be generated by an electron beam lithography system on a resist material in accordance with some embodiments of the present disclosure. FIG. 6 shows the layout pattern 112C which is consistent with layout 112A of FIG. 2A having dark strips 111 and bright strips 116. The dark strips 111 of FIG. 6 have an additional edge portion 126 in addition to the middle portion 128 that is consistent with the dark strips 114 of FIG. 2A. In some embodiments, the edge portion 126 has a width between about 1 percent to about 20 percent, e.g., 5 percent, of the width of the dark strips 111. In the edge portion 126 the resist material receives, by direct exposure, a higher dose of electron density, e.g., energy density, compared to the middle portion 128. In some embodiments, the width of the edge portion is not a constant value and changes for different shapes, e.g., the dark strips 111, of a layout pattern.

Figure 7C:
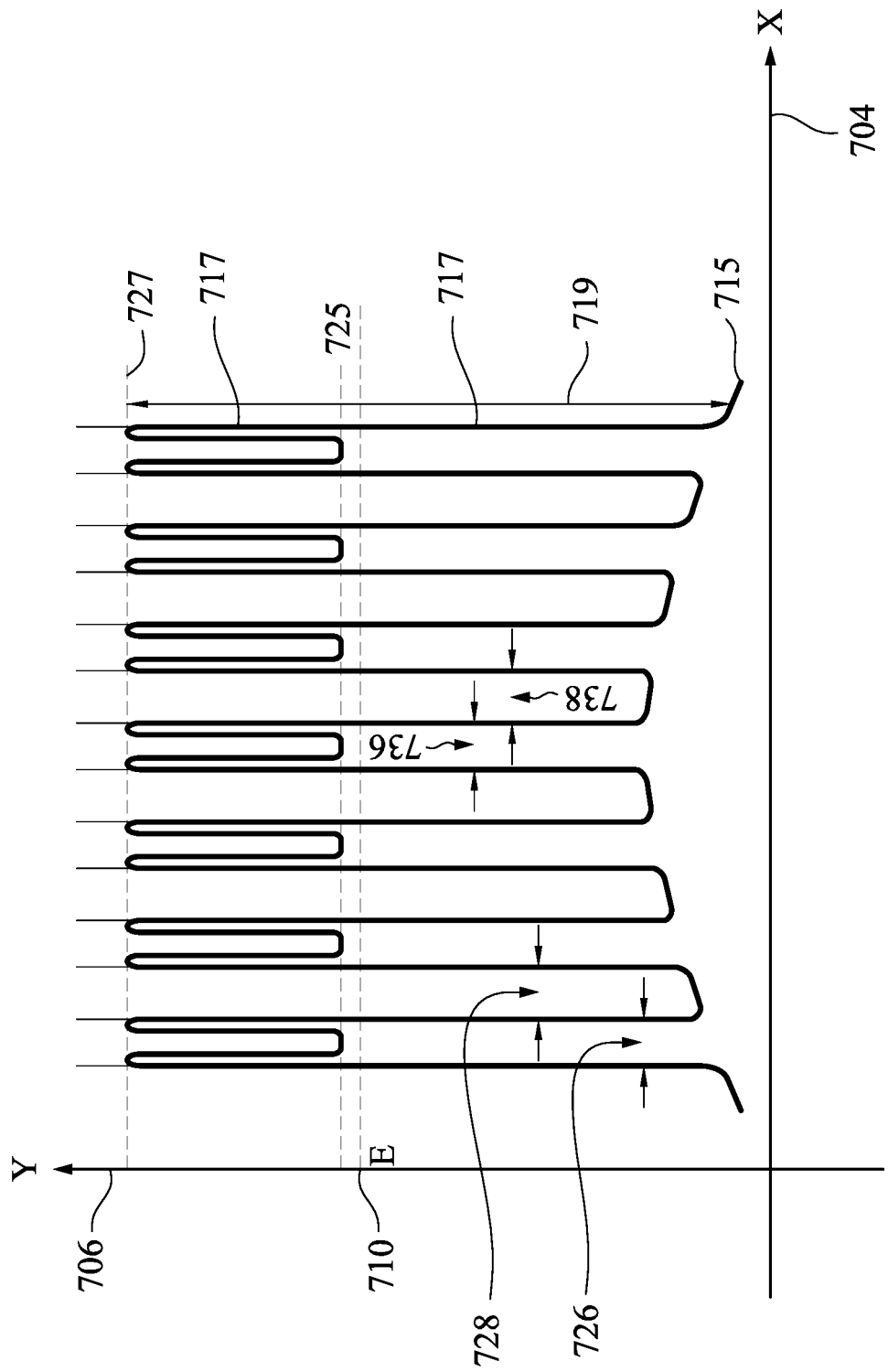

FIGS. 7A, 7B, and 7C respectively show a cross-sectional view of a layout pattern of a resist produced by a charged particle lithography system, e.g., an electron beam lithography system, energy density delivered by the electron beam lithography system to the resist material, and a graph of the energy density delivered by the electron beam lithography system to the resist material in accordance with some embodiments of the present disclosure. FIG. 7A which is consistent with FIGS. 3A, 4A, and 5A shows a cross-sectional view of a height of a layout pattern on a resist material on a wafer versus location. The cross-sectional view, on the coordinate 707, shows a height 705 at a region 216 and shows a height zero at a region 218 in the X-coordinate 704.

FIG. 7B shows the energy density (ED) versus location that is delivered by the electron beam lithography system. FIG. 7B shows, on a coordinate 706, the energy density directly exposed to the resist material at different locations of the X-coordinate 704. In some embodiments, the resist material is a negative tone resist material and the energy density, energy per unit area, to fully expose the resist material is a threshold energy level 710. In some embodiments as shown in FIG. 7B, an energy density function 709 is applied to the resist material such that at the regions 216 an energy level which is smaller than the threshold energy level 710, which is the threshold energy level, is applied by the electron-beam lithography system 100 to the middle portion of the regions 216 and no energy is applied to the regions 218. The energy density function 709 in the middle portion of the regions 216 is consistent with the energy density function 409 of FIG. 5B. In addition, the energy density function 709 is higher in an edge portion of the regions 216 compared to the middle portion of the regions 216 by about 10 percent to about 300 percent. In some embodiments, the energy density function 709 at the edge portion is not a constant and varies for different dark strips 111. The edge portion of the regions 216 is consistent with the edge portion 126 of the dark strips 111 of FIG. 6. A top energy density curve of energy density function 709 in the middle portion of the regions 216 is the envelope 735 which is consistent with the envelope 435 of FIG. 5B. In addition, the energy density function 709 is higher in the edge portion of the regions 216 compared to the middle portion of the regions 216 by about 10 percent to about 300 percent, e.g., 100 percent. Thus, a top energy density curve of energy density function 709 at the edge portion of the regions 216 is the envelope 737 which is higher than the envelope 735 by about 10 percent to about 300 percent.

FIG. 7C shows a graph of the energy density in the resist material. FIG. 7C shows the graph of the energy density ED at different locations on the X-coordinate 704. A total energy density 717 delivered to the resist material is a sum of the energy density 715 due to indirect exposure and the energy density on top of the energy density 715 distributed between the limits of the arrow 719 due to direct exposure of the regions 216. The direct exposure is received in the regions 216 according to the energy density function 709 shown in FIG. 7B and thus the direct exposure is smaller in the middle of the regions 216 compared to the edges of the regions 216. In some embodiments, the energy density 715 of the indirect exposure is a convolution of the equation (1) with the energy density function 709. A total energy density envelope 725 delivered to the resist material in the middle portion of the regions 216 is a sum of the energy density 715 of the indirect exposure and the energy density of direct exposure in the middle portion of the regions 216. In addition, a total energy density envelope 727 delivered to the resist material in the edge portion of the regions 216 is a sum of the energy density 715 of the indirect exposure and the energy density of direct exposure in the edge portion of the regions 216, and, thus, the envelope 727 is higher than the envelope 725.

In some embodiments as shown in FIG. 7C, the total exposure energy density, which is the sum of energy density 715 of indirect exposure and the direct exposure at the edge portion of the regions 216 is considerably more than the threshold energy level 710. However, the total exposure energy density in the middle portion of the regions 216 is about the threshold energy level 710. In some embodiments, when determining, e.g., calculating, the envelope 735, the effect of the higher energy density in the edge portions of the regions 216 on the energy density 715 of indirect exposure is also calculated to obtain a CD uniformity of the layout pattern.

In some embodiments, the CD of the directly exposed regions 216 increases because of the energy density 715 of the indirect exposures increase. The energy density 715 of the indirect exposures is higher near the center of the layout pattern and thus the direct exposure of the middle portion of the regions 216 is smaller in the center of the layout pattern such that the total exposure is the same for all of the middle portion of the regions 216. Thus, a CD 736 of a region 216 in the center of the layout pattern is equal to a CD 726 of a region 216 at an edge of the layout pattern. Also, a width 738 of the unexposed region 218 in the center of the layout pattern is equal to a width 728 of the unexposed region 218 at an edge of the layout pattern. In some embodiments, the higher energy density at the edge portions of the regions 216 increases the contrast. The increase in contrast may provide a lower line edge roughness (LER) and a better CD uniformity compared to when the higher energy density is not used at the edge portion of the regions 216.

Figure 8:
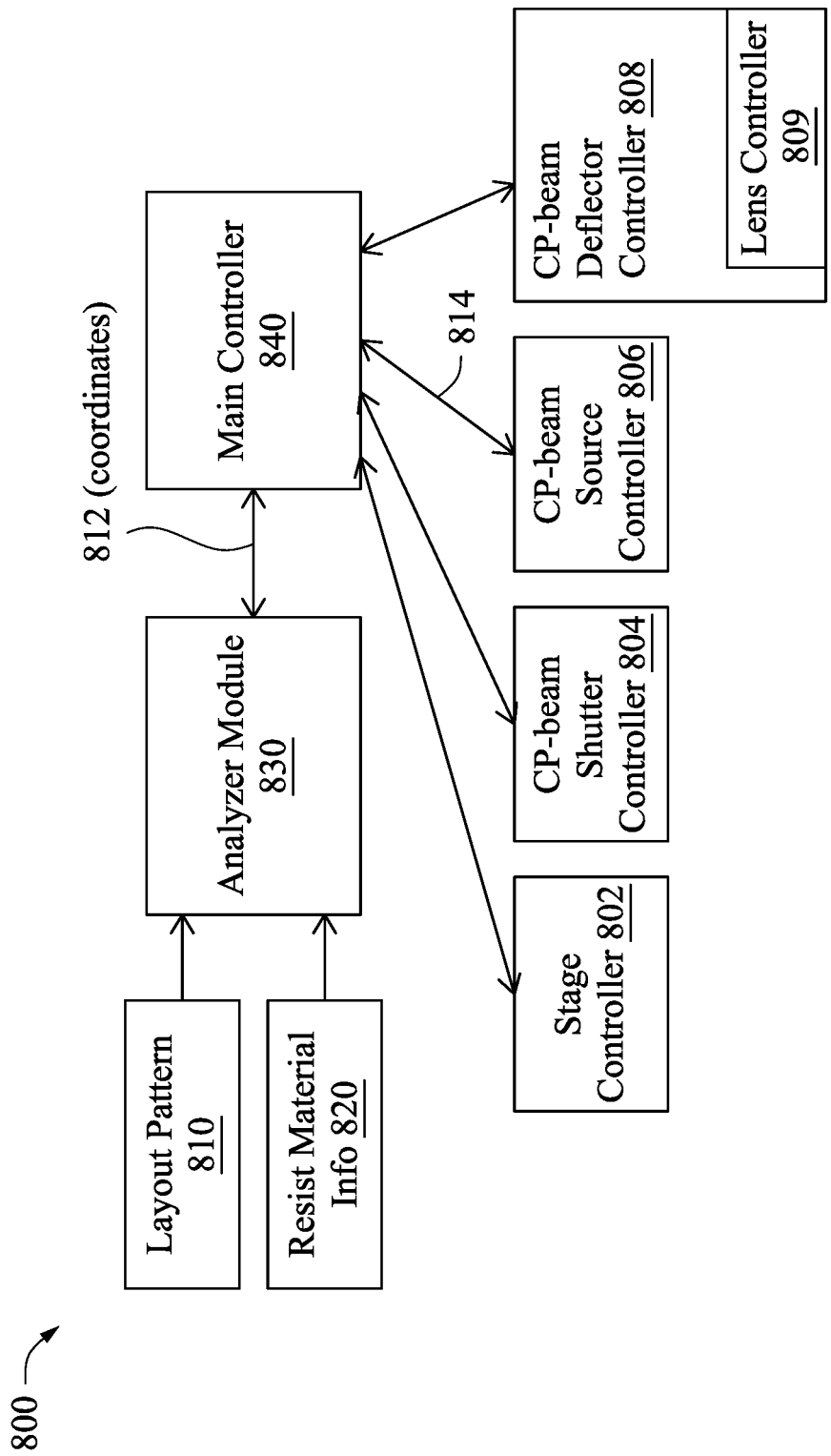
FIG. 8 shows a control system for controlling an amount of energy delivered by an electron beam to a resist material on a wafer to generate a layout pattern on the wafer in accordance with some embodiments of the present disclosure.

FIG. 8 shows a control system 800 for controlling an amount of energy delivered by an electron beam to a resist material on a wafer to generate a layout pattern on the wafer, in accordance with some embodiments of the present disclosure. The control system 800 includes an analyzer module 830 and a main controller 840 coupled to each other. The analyzer module 830 receives a layout pattern 810 to be generated on a resist material on a wafer. The analyzer module 830 also receives information of the resist material, e.g., the resist material information 820, and the information of an electron-beam to generate the layout pattern 810 in the resist material. The analyzer may receive, from the resist material information 820, a type of the resist material such as a positive tone resist material or a negative tone resist material and an energy density that should be delivered to the resist material to fully expose the resist material.

In some embodiments, the main controller 840 is coupled to a charged particle beam source controller 806, e.g., an electron beam source controller, a charged particle shutter controller 804, e.g., an electron beam shutter controller, and a charged particle beam deflector controller 808, e.g., an electron beam deflector controller. In some embodiments, the analyzer module 830 receives the information of the electron-beam, e.g., electron-beam information 814, via the main controller 840, from the charged particle beam source controller 806. In some embodiments and returning back to FIGS. 1A and 1B, the main controller 840 and the stage controller 802 are included in the controller 135 and the charged particle shutter controller 804 and the charged particle beam deflector controller 808 are consistent with shutter-deflector unit 108. In some embodiments, the charged particle beam deflector controller 808 includes a lens controller 809 that is used for controlling the focusing lenses 106 and 109 and is used for focusing the electron beam on the resist material on the wafer.

In some embodiments, the electron-beam information 814 includes an intensity of the electron-beam, e.g., the intensity of electron beam produced by the electron source 102 of FIG. 1A on the resist material on the semiconductor wafer 120. In some embodiments, the intensity of the electron beam, e.g., the intensity of electron beam 134 of FIG. 1A, includes an energy per unit area delivered by the electron beam to the resist material. In some embodiments, the intensity of the electron beam is received from the charged particle beam source controller 806. In some embodiments, the analyzer module 830 uses the layout pattern 810 and the resist material info 820 to determine an amount of energy each location of the resist material on the wafer receives to generate the layout pattern 810 on the wafer. Then, the analyzer module 830 uses the electron-beam information 814 to determine a choreography 812 of the stage movements and electron beam deflections to generate the layout pattern on the wafer. In some embodiments, the determined choreography 812 includes a set of instructions and timings of the instructions for the stage controller 802, the charged particle shutter controller 804, the charged particle beam source controller 806, and the charged particle beam deflector controller 808. In some embodiments, the determined choreography 812 includes determining a setting for the intensity of the electron beam, e.g., an energy of the electron beam, a duration of time the electron beam is turned on or off at each location of the resist material, and a trajectory of the electron beam to generate the layout pattern 810 on the wafer. In some embodiments and referring back to FIG. 5C, the determined choreography 812 limits the amount of electron beam energy density delivered to each directly exposed region by the threshold energy level 410. By limiting the amount of electron beam energy density delivered to each directly exposed region, a CD uniformity is maintained in the generated layout pattern and the indirect exposure of the neighboring areas is limited. In some embodiments, the amount of electron beam energy density 417 is limited by a slightly higher envelope 425, which is about 1 to about 10 percent, e.g., 5 percent, higher than threshold energy level 410. In some embodiments and referring to FIG. 7C, the electron beam energy density 717 is limited in the middle portion of the region 216 by an envelope 725, which is consistent with the envelope 425 of FIG. 5C. As discussed, the electron beam energy density 717 has a higher envelope 727 at the edge portion of the region 216, which is about 5 percent to 50 percent, e.g., 20 percent, higher than threshold energy level 410. The higher energy density at the edge portion of the regions 216 may increase the contrast that may provide a lower line edge roughness and a better CD uniformity compared to when the higher energy density is not used at the edge portion of the regions 216.

In some embodiments, the analyzer module 830 sends the determined choreography 812 to the main controller 840 to command the charged particle beam source controller 806, the charged particle shutter controller 804, and the charged particle beam deflector controller 808 according to the determined choreography 812. In some embodiments, the main controller 840, in addition to the charged particle beam deflector controller 808 is also coupled to a stage controller 802 to move a stage, e.g., stage 110 of FIGS. 1A and 1B, and in addition or instead of deflecting the electron beam, the stage controller 802 moves the stage to generate the layout pattern on a wafer, e.g., semiconductor wafer 120 of FIGS. 1A and 1B on the stage 110. In some embodiments as shown in FIG. 1B, the beam forming unit 104 generates multiple electron beams and the charged particle beam deflector controller 808 controls multiple beams and simultaneously generates multiple locations of a layout pattern or simultaneously generates multiple layout patterns on a wafer.

Figure 9:
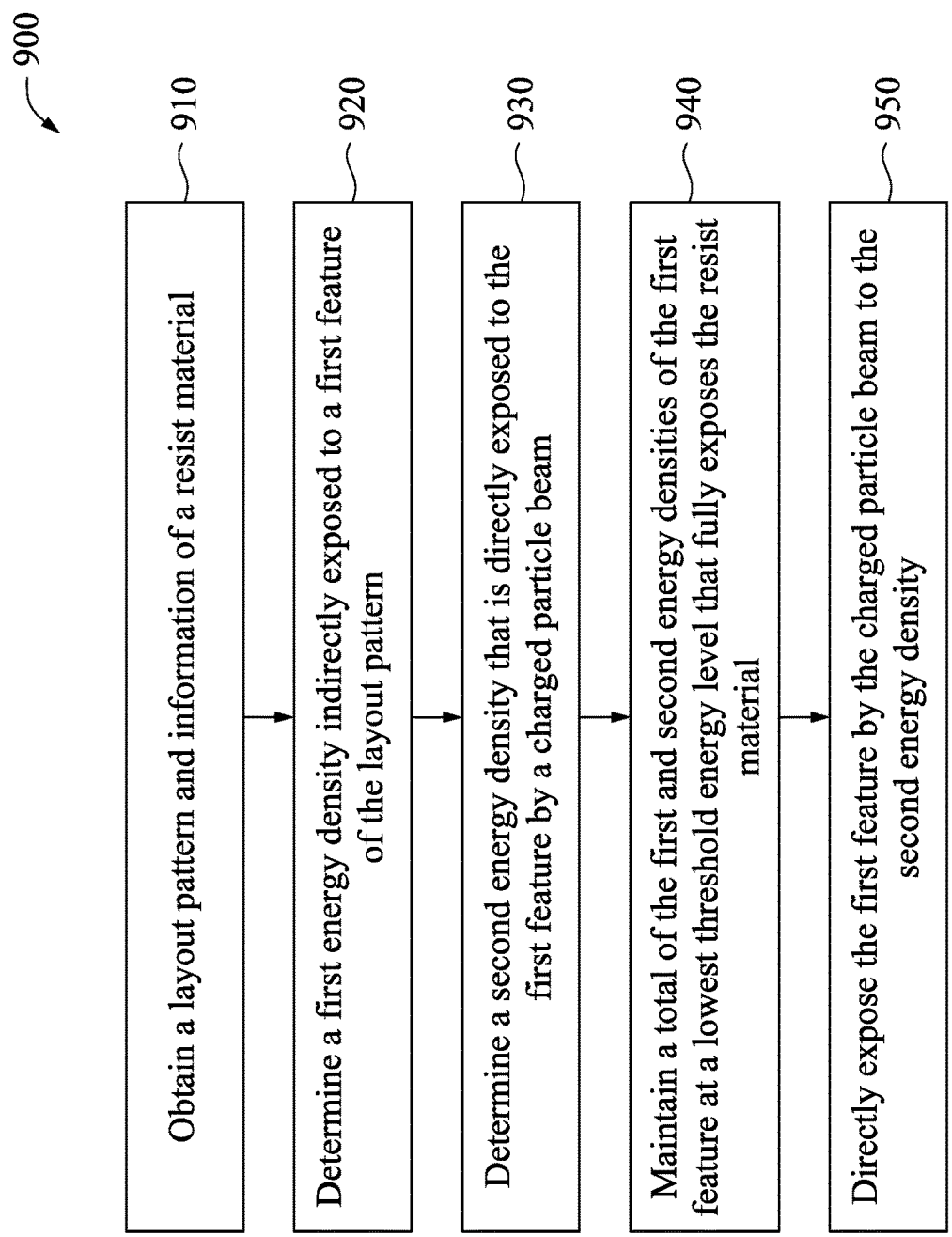
FIG. 9 illustrates a flow diagram of an exemplary process for controlling an amount of energy delivered by an electron beam to a resist material on a wafer to generate a layout pattern on the wafer in accordance with some embodiments of the present disclosure.

FIG. 9 illustrates a flow diagram of an exemplary process 900 for controlling an amount of energy delivered by a charged particle beam to a resist material on a wafer to generate a layout pattern on the wafer in accordance with some embodiments of the present disclosure. In some embodiments, the process 900 is performed by the control system 800 of FIG. 8 or the computer system 1000 of FIGS. 10A and 10B. In operation 910, a layout pattern and a resist material information are obtained. The resist material information may include the type, which includes a positive tone resist material or a negative tone resist material, and an energy density, e.g., energy per unit area, that the resist material needs to become fully exposed. In some embodiments as discussed above with respect to FIG. 8, the layout pattern 810 and the resist material information 820 are received by the control system 800. In some embodiments, the layout pattern 810 and the resist material information 820 are received by the analyzer module 830. In some embodiments and as shown in FIGS. 2A and 2B, the layout pattern includes two or more features, e.g., the dark strips 114 and/or the bright strips 116.

At operation 920, a first energy density that is indirectly exposed to a first feature of the layout pattern is determined. In some embodiments and returning back to FIG. 2A, the first feature is the central dark strip 115 of the dense area 113. In some embodiments, the first energy density is determined, e.g., calculated or estimated, when a charged particle, e.g., the electron beam 134 of FIG. 1A or the electron beams 134 of FIG. 1B, exposes energy to the other features of the layout pattern, e.g., the other dark strips 114 of the dense area 113 but does not expose energy to the central dark strip 115.

At operation 930, a second energy density that is directly exposed to the first feature by the charged particle beam is determined. In some embodiments, the second energy density is determined, e.g., calculated or estimated, when the charged particle, e.g., the electron beam 134 of FIG. 1A, exposes energy to the first feature, e.g., the central dark strip 115.

At operation 940, a total of the first and second energy densities of the first feature is maintained at a lowest threshold energy level that fully exposes the resist material. In some embodiments, the first energy density is indirectly received when one or more features of the layout pattern, excluding the first feature, are directly exposed to the charged particle beam energy. In some embodiments, the second energy density is directly received when the first feature of the layout pattern is directly exposed to the charged particle beam energy. In some embodiments, the direct exposure of the first feature and the indirect exposure of the first feature occur simultaneously by a multi-beam electron beam lithography system 150 of FIG. 1B having two or more, e.g., 5, electron beams. In some embodiments, the direct exposure of the first feature and the indirect exposure of the first feature occur successively by an beam electron beam lithography system, however, a degradation of the positive tone resist material or a strengthening of the negative tone resist material by the direct and indirect exposures is combined.

At operation 950, a total of the first feature is directly exposed by the charged particle beam to the second energy density. As noted above, the first feature of the layout pattern and the other features of the layout pattern may simultaneously be exposed to the charged particle beam.

Figure 10A:
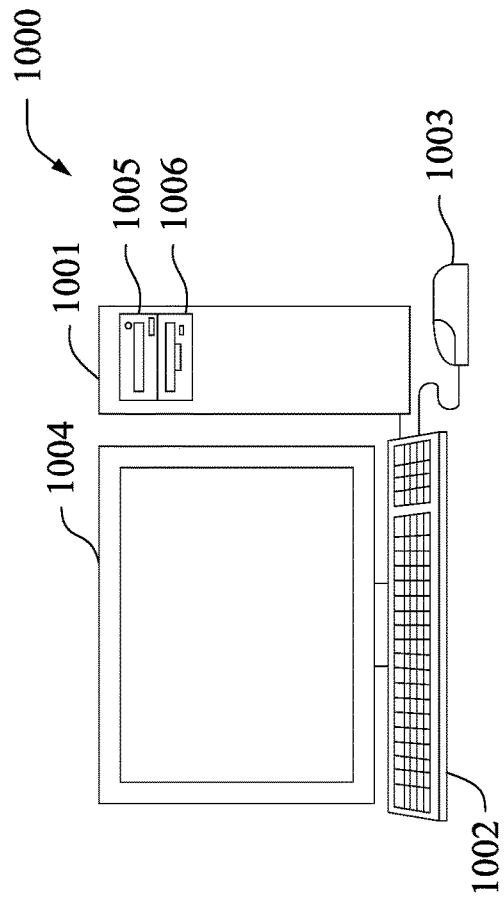
FIGS. 10A and 10B illustrate an apparatus for controlling an amount of energy delivered by an electron beam to a resist material on a wafer to generate a layout pattern on the wafer in accordance with some embodiments of the present disclosure.
Figure 10B:
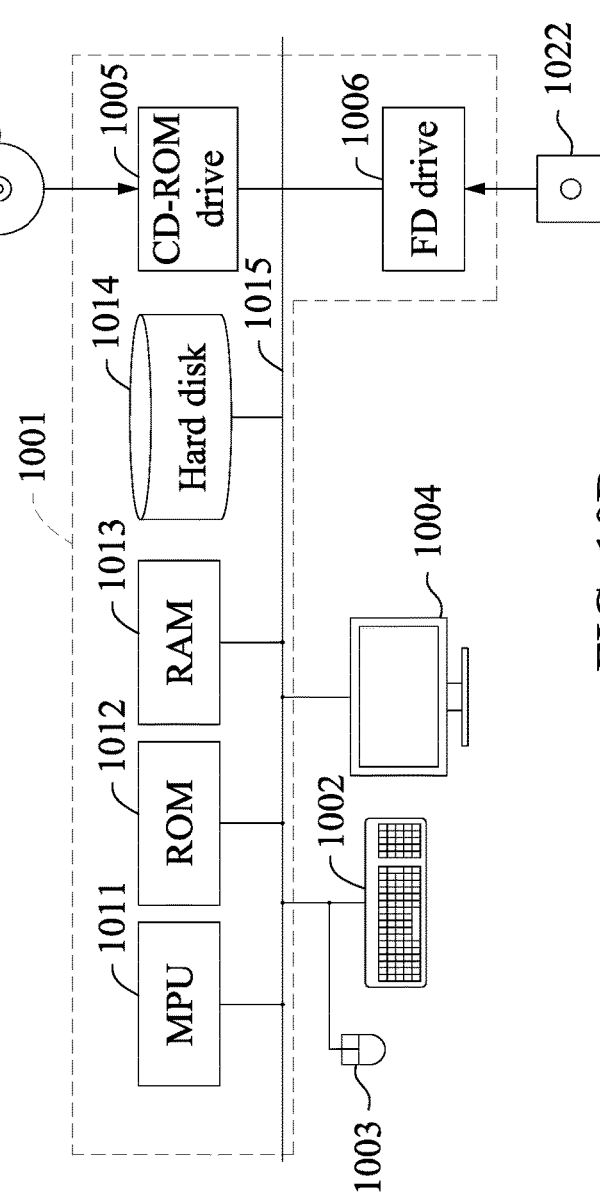

FIGS. 10A and 10B illustrate an apparatus for controlling an amount of energy delivered by an electron beam to a resist material on a wafer to generate a layout pattern on the wafer in accordance with some embodiments of the present disclosure. In some embodiments, the computer system 1000 is used for performing the functions of the modules of FIG. 8 that include the main controller 840, the analyzer module 830, the stage controller 802, charged particle shutter controller 804, the charged particle beam source controller 806, and the charged particle beam deflector controller 808. In some embodiments, the computer system 1000 is used to execute the process 900 of FIG. 9. In some embodiments, the computer system 1000 is used to perform the functions of controller 135 of FIGS. 1A and 1B. As noted above, the amount of energy, e.g., the energy density, delivered by the electron beam to a first region on the resist material includes an amount of energy delivered by direct exposure of the electron beam to the first region of one or more exposed regions of the resist material. Also, the amount of energy delivered by the electron beam to the first region includes an amount of energy delivered by indirect exposure such that the indirect exposure is generated by direct exposure of the other exposed regions and the scattering of the electron beam from the other exposed regions. In some embodiments, the computer system 1000 determines, e.g., simulates, a total amount of energy delivered to the first region by determining the amounts of electron beam energy delivered by both direct exposure and indirect exposure. In addition, the computer system 1000 may determine a total amount of energy delivered to the first region and the other the exposed regions to maintain the delivered total energy at a threshold energy level. FIG. 10A is a schematic view of a computer system that performs the functions of an apparatus for controlling an amount of energy delivered by an electron beam. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIGS. 10A and 10B illustrate an apparatus for controlling an amount of energy delivered by an electron beam to a resist material according to some embodiments of the present disclosure. FIG. 10A is a schematic view of a computer system the process of controlling the amount of energy delivered by an electron beam to a resist material according to one or more embodiments as described above. All of or a part of the processes, method and/or operations of the foregoing embodiments can be realized using computer hardware and computer programs executed thereon. The operations include simulating the charged particle beam exposure to a resist material and simulating the charged particle beam shutter and deflector. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors 1011, such as a micro processing unit (MPU), a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions of the control system for controlling an amount of energy delivered by an electron beam to a resist material in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the control system for controlling an amount of energy delivered by an electron beam to a resist material in the foregoing embodiments. The program may only include a command portion to call an appropriate function (module) in a controlled mode and obtain desired results.

As discussed, the embodiments above may generate a uniform CD of the layout pattern between the features of a dense area of the layout pattern and the features of a dispersed area of the layout pattern when the layout pattern is generated in a resist material. In addition, an extension of the exposed areas to the neighboring areas for the fully exposed features of the dense area and the fully exposed features of the dispersed area is reduced.

According to some embodiments of the present disclosure, a method of generating a layout pattern on a resist material includes determining a first energy density indirectly exposed to a first feature of one or more features of a layout pattern on an energy-sensitive material when the one or more features of the layout pattern in the energy-sensitive material are directly exposed by a charged particle beam. The method further includes adjusting a second energy density exposed to the first feature when the first feature is directly exposed by the charged particle beam, such that a total energy density received by the first feature is a sum of the first energy density from the indirect exposure and the second energy density from the direct exposure. The total energy density is maintained at about a threshold energy level to fully expose the first feature in the energy-sensitive material. In an embodiment, the method further includes that prior to the determining the first energy density, obtaining the layout pattern having the one or more features to be generated in the energy-sensitive material on a work piece. In an embodiment, the first feature comprises a width, a length, and an inside region surrounded by an edge region. The method further includes directly exposing the inside region of the first feature of the layout pattern by the charged particle beam to the second energy density and directly exposing the edge region of the first feature of the layout pattern by the charged particle beam to an electron density greater than the second energy density. In an embodiment, a width of the edge region is between 0.5 nm to 50 nm. the method further includes obtaining information of the energy-sensitive material before the adjusting the second energy density and maintaining the total energy density of the inside region of the first feature at the threshold energy level to fully expose the energy-sensitive material based on the information of the energy-sensitive material. The threshold energy level is a lowest energy density that fully exposes the energy-sensitive material of the inside region of the first feature. The method also includes directly exposing the edge region of the first feature with the electron density that is between 1 percent to 1000 percent greater than the second energy density. In an embodiment, the one or more features of the layout pattern comprises at least two features. The method further includes maintaining a critical dimension (CD) uniformity between the at least two features of the layout pattern by maintaining the total energy density in the inside region of the at least two features of the layout pattern at a same energy level, or reducing a change in the CD of the at least two features of the layout pattern by maintaining the total energy density of the at least two features at about the threshold energy level. In an embodiment, the determining the first energy density further includes receiving the first energy density from a scattering of the direct exposure of the charged particle beam in the one or more features. In an embodiment, the energy-sensitive material is a negative tone energy-sensitive material. The method further includes exposing the two or more features of the layout pattern in the resist material to the threshold energy level to fully expose the negative tone energy-sensitive material, and applying a developer to dissolve and remove un-exposed regions of the resist material. In an embodiment, the energy-sensitive material is a positive tone energy-sensitive material. The method also includes exposing the two or more features of the layout pattern in the energy-sensitive material to the threshold energy level to fully expose the positive tone energy-sensitive material, and applying a developer to dissolve and remove the two or more features of the layout pattern. In an embodiment, the method also includes determining one or more timings for turning on and off the charged particle beam, and determining one or more deflection angles for the charged particle beam to expose the first feature to the second energy density. In an embodiment, the method also includes adjusting the second energy density by adjusting an energy directly delivered by the charged particle beam to the first feature, and maintaining a sum of the first energy density and the second energy density delivered to the first feature at about the threshold energy level. In an embodiment, the method also includes adjusting the first energy density indirectly delivered by the charged particle beam to the one or more features of the layout pattern, adjusting the second energy density directly delivered by the charged particle beam to the one or more features of the layout pattern, and maintaining, for each feature, a sum of the first energy density indirectly delivered and the second energy density directly delivered at about the threshold energy level. In an embodiment, the method also includes adjusting the energy directly delivered by the charged particle beam to the one or more features by adjusting a charged particle beam intensity, and adjusting a charged particle beam exposure time.

According to some embodiments of the present disclosure, a method of generating a layout pattern on a resist material includes obtaining a layout pattern comprising one or more features to be generated on an energy-sensitive material on a work piece, and obtaining information of the energy-sensitive material. The method includes determining a first energy density indirectly exposed to a first feature of the one or more features of the layout pattern in the energy-sensitive material when the one or more features of the layout pattern in the energy-sensitive material are directly exposed by a charged particle beam. The method further includes determining a second energy density of the first feature when the first feature is directly exposed by the charged particle beam. The method includes maintaining a total energy density of the first feature that is a sum of the first energy density from the indirect exposure and the second energy density from the direct exposure at about a threshold energy level that is, based on the information of the energy-sensitive material at a lowest energy density that fully exposes the energy-sensitive material. The method further includes directly exposing the first feature of the layout pattern by the charged particle beam to the second energy density. In an embodiment, the method further includes adjusting the first energy density by adjusting an energy directly delivered by the charged particle beam to the one or more features, adjusting the second energy density by adjusting an energy directly delivered by the charged particle beam to the first feature, and maintaining the sum of the first energy density and the second energy density delivered to the first feature at about the threshold energy level. In an embodiment, the method further includes adjusting the first energy density indirectly delivered by the charged particle beam to the one or more features of the layout pattern, adjusting the second energy density directly delivered by the charged particle beam to the one or more features of the layout pattern, and maintaining, for each feature, a sum of the first energy density indirectly delivered and the second energy density directly delivered at about the threshold energy level.

According to some embodiments of the present disclosure, a control system for generating a layout pattern on an energy-sensitive material includes a main controller, and an analyzer module coupled to the main controller. The analyzer module receives a layout pattern including one or more features and information of the energy-sensitive material. The layout pattern is produced by a charged particle beam in the energy-sensitive material on a work piece. The analyzer module determines a first energy density indirectly exposed to a first feature of the one or more features of the layout pattern in the energy-sensitive material when the one or more features of the layout pattern in the energy-sensitive material are directly exposed by the charged particle beam. The analyzer module adjusts a second energy density of the first feature when the first feature is directly exposed by the charged particle beam. A total energy density of the first feature is a sum of the first energy density from the indirect exposure and the second energy density from the direct exposure. The total energy density is maintained at about a threshold energy level that is a lowest energy density that fully exposes the energy-sensitive material. The analyzer module also generates a set of commands that includes one or more timings and one or more deflection angles for the main controller to control the charged particle beam to directly expose the first feature of the layout pattern to the second energy density. In an embodiment, the control system further includes a charged particle shutter controller coupled to the main controller that turns one or more electron beams on or off by the set of commands received from the main controller, and a charged particle beam deflector controller coupled to the main controller that deflects a direction of the one or more charged particle beams by the set of commands received from the main controller. By turning on and off the one or more charged particle beams and by deflecting the direction of the one or more electron beams the layout pattern is generated in the energy-sensitive material. In an embodiment, the control system further includes a stage controller coupled to the main controller that moves a stage of the work piece. By turning on and off the one or more charged particle beams and by deflecting the direction of the one or more electron beams and/or by moving the stage the layout pattern is generated in the energy-sensitive material. In an embodiment, the control system further includes a charged particle beam source controller coupled to the main controller that sets an intensity of the one or more charged particle beams. The intensity of a charged particle beam is an amount of energy delivered by the charged particle beam to the energy-sensitive material to produce an energy density on the energy-sensitive material. In an embodiment, the control system maintains a critical dimension (CD) of the one or more features of the layout pattern to a specific width, the specific width is in a range of about 0.1 nm to about 1000 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating a layout pattern, comprising:
   determining a first energy density indirectly exposed to a first feature of one or more features of a layout pattern on an energy-sensitive material when the one or more features of the layout pattern in the energy-sensitive material are directly exposed by a charged particle beam; and
   adjusting a second energy density exposed to the first feature when the first feature is directly exposed by the charged particle beam, so that a total energy density received by the first feature is a sum of the first energy density from the indirect exposure and the second energy density from the direct exposure, and the total energy density is maintained at a threshold energy level to fully expose the first feature in the energy-sensitive material.

2. The method of claim 1, further comprising:
   prior to the determining the first energy density, obtaining the layout pattern having the one or more features to be generated in the energy-sensitive material on a work piece.

3. The method of claim 1, wherein the first feature comprises a width, a length, and an inside region surrounded by an edge region, the method further comprising:
   directly exposing the inside region of the first feature of the layout pattern by the charged particle beam to the second energy density; and
   directly exposing the edge region of the first feature of the layout pattern by the charged particle beam to an electron density greater than the second energy density.

4. The method of claim 3, wherein a width of the edge region is between 0.5 nm to 50 nm, the method further comprising:
   obtaining information of the energy-sensitive material before the adjusting the second energy density;
   maintaining the total energy density of the inside region of the first feature at the threshold energy level to fully expose the energy-sensitive material based on the information of the energy-sensitive material, wherein the threshold energy level is a lowest energy density that fully exposes the energy-sensitive material of the inside region of the first feature; and
   directly exposing the edge region of the first feature with the electron density that is between 1 percent to 1000 percent greater than the second energy density.

5. The method of claim 4, wherein the one or more features of the layout pattern comprises at least two features, the method further comprising:

maintaining a critical dimension (CD) uniformity between the at least two features of the layout pattern by maintaining the total energy density in the inside region of the at least two features of the layout pattern at a same energy level; or reducing a change in the CD of the at least two features of the layout pattern by maintaining the total energy density of the at least two features at the threshold energy level.

6. The method of claim 1, wherein the determining the first energy density further comprises:
receiving the first energy density from a scattering of the direct exposure of the charged particle beam in the one or more features.

7. The method of claim 4, wherein the energy-sensitive material is a negative tone energy-sensitive material, further comprising:
exposing the two or more features of the layout pattern in the energy-sensitive material to the threshold energy level to fully expose the negative tone energy-sensitive material; and
applying a developer to dissolve and remove un-exposed regions of the energy-sensitive material.

8. The method of claim 4, wherein the energy-sensitive material is a positive tone energy-sensitive material, further comprising:
exposing the two or more features of the layout pattern in the energy-sensitive material to the threshold energy level to fully expose the positive tone energy-sensitive material; and
applying a developer to dissolve and remove the two or more features of the layout pattern.

9. The method of claim 1, further comprising:
determining one or more timings for turning on and off the charged particle beam; and determining one or more deflection angles for the charged particle beam to expose the first feature to the second energy density.

10. The method of claim 4, further comprising:
adjusting the first energy density by adjusting an energy directly delivered by the charged particle beam to the one or more features;
adjusting the second energy density by adjusting an energy directly delivered by the charged particle beam to the first feature; and
maintaining a sum of the first energy density and the second energy density delivered to the first feature at about the threshold energy level.

11. The method of claim 10, further comprising:
adjusting the first energy density indirectly delivered by the charged particle beam to the one or more features of the layout pattern;
adjusting the second energy density directly delivered by the charged particle beam to the one or more features of the layout pattern; and
maintaining, for each feature, a sum of the first energy density indirectly delivered and the second energy density directly delivered at the threshold energy level.

12. The method of claim 10, further comprising:
adjusting the energy directly delivered by the charged particle beam to the one or more features by:
adjusting a charged particle beam intensity; and
adjusting a charged particle beam exposure time.

13. A method of generating a layout pattern, comprising:
obtaining a layout pattern comprising one or more features to be generated on an energy-sensitive material on a work piece;
obtaining information of the energy-sensitive material;
determining a first energy density indirectly exposed to a first feature of the one or more features of the layout pattern in the energy-sensitive material when the one or more features of the layout pattern in the energy-sensitive material are directly exposed by a charged particle beam;
determining a second energy density of the first feature when the first feature is directly exposed by the charged particle beam;
maintaining a total energy density of the first feature that is a sum of the first energy density from the indirect exposure and the second energy density from the direct exposure at a threshold energy level that is, based on the information of the energy-sensitive material at a lowest energy density that fully exposes the energy-sensitive material; and
directly exposing the first feature of the layout pattern by the charged particle beam to the second energy density.

14. The method of claim 13, further comprising:
adjusting the first energy density by adjusting an energy directly delivered by the charged particle beam to the one or more features;
adjusting the second energy density by adjusting an energy directly delivered by the charged particle beam to the first feature; and
maintaining the sum of the first energy density and the second energy density delivered to the first feature at the threshold energy level.

15. The method of claim 13, further comprising:
adjusting the first energy density indirectly delivered by the charged particle beam to the one or more features of the layout pattern;
adjusting the second energy density directly delivered by the charged particle beam to the one or more features of the layout pattern; and
maintaining, for each feature, a sum of the first energy density indirectly delivered and the second energy density directly delivered at the threshold energy level.

16. A control system for generating a layout pattern on an energy-sensitive material, comprising:
a main controller; and
an analyzer module coupled to the main controller, wherein the analyzer module is configured to receive a layout pattern comprising one or more features and information of the energy-sensitive material, wherein the layout pattern is produced by a charged particle beam in the energy-sensitive material on a work piece, and wherein the analyzer module is configured to:
determine a first energy density indirectly exposed to a first feature of the one or more features of the layout pattern in the energy-sensitive material when the one or more features of the layout pattern in the energy-sensitive material are directly exposed by the charged particle beam;
adjust a second energy density of the first feature when the first feature is directly exposed by the charged particle beam, wherein a total energy density of the first feature that is a sum of the first energy density from the indirect exposure and the second energy density from the direct exposure, and the total energy density is maintained at a threshold energy level that is a lowest energy density that fully exposes the energy-sensitive material; and
generate a set of commands that comprises one or more timings and one or more deflection angles for the main controller to control the charged particle beam to directly expose the first feature of the layout pattern to the second energy density.

17. The control system of claim 16, further comprising:
a charged particle beam shutter controller coupled to the main controller and configured to turn one or more charged particle beam on or off by the set of commands received from the main controller;
a charged particle beam deflector controller coupled to the main controller and configured to deflect a direction of the one or more charged particle beams by the set of commands received from the main controller; and
wherein by turning on and off the one or more charged particle beams and by deflecting the direction of the one or more charged particle beams the layout pattern is generated in the energy-sensitive material.

18. The control system of claim 17, further comprising:
a stage controller coupled to the main controller and configured to move a stage of the work piece, wherein by turning on and off the one or more charged particle beams and by deflecting the direction of the one or more charged particle beams and/or by moving the stage the layout pattern is generated in the energy-sensitive material.

19. The control system of claim 17, further comprising:
a charged particle beam source controller coupled to the main controller and configured to set an intensity of the one or more charged particle beams, wherein the intensity of a charged particle beam is an amount of energy delivered by the charged particle beam to the energy-sensitive material to produce an energy density on the energy-sensitive material.

20. The control system of claim 16, wherein the control system is configured to maintain a critical dimension (CD) of the one or more features of the layout pattern to a specific width, the specific width is in a range of 0.1 nm to 1000 nm.

* * * * *